(12) United States Patent
Hayashi et al.

(10) Patent No.: US 8,926,068 B2
(45) Date of Patent: Jan. 6, 2015

(54) LIQUID DISCHARGE HEAD, METHOD OF MANUFACTURING LIQUID DISCHARGE HEAD, AND IMAGE FORMING DEVICE

(75) Inventors: Keisuke Hayashi, Kanagawa (JP); Takeshi Sano, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 59 days.

(21) Appl. No.: 13/345,977

(22) Filed: Jan. 9, 2012

(65) Prior Publication Data
US 2012/0182356 A1    Jul. 19, 2012

(30) Foreign Application Priority Data

Jan. 14, 2011  (JP) ................. 2011-006055
Mar. 18, 2011  (JP) ................. 2011-060225
May 20, 2011  (JP) ................. 2011-113263

(51) Int. Cl.
| | | |
|---|---|---|
| B41J 2/045 | (2006.01) | |
| B41J 2/14 | (2006.01) | |
| H01L 41/047 | (2006.01) | |
| H01L 27/20 | (2006.01) | |
| H01L 41/083 | (2006.01) | |
| H01L 41/338 | (2013.01) | |

(52) U.S. Cl.
CPC ......... B41J 2/14274 (2013.01); H01L 41/0475 (2013.01); H01L 27/20 (2013.01); H01L 41/0831 (2013.01); H01L 41/338 (2013.01)

USPC ........................................................... 347/68

(58) Field of Classification Search
None
See application file for complete search history.

(56) References Cited

U.S. PATENT DOCUMENTS

| | | | |
|---|---|---|---|
| 5,432,540 A * | 7/1995 | Hiraishi | ................ 347/69 |
| 7,651,205 B2 | 1/2010 | Hayashi | |
| 7,871,153 B2 | 1/2011 | Hayashi | |
| 8,042,918 B2 | 10/2011 | Hayashi | |
| 2008/0055362 A1* | 3/2008 | Irinoda | ................ 347/51 |
| 2009/0179527 A1* | 7/2009 | Kaspar et al. | ............ 310/366 |
| 2009/0256446 A1* | 10/2009 | Funakubo | ........... 310/323.16 |
| 2011/0211021 A1 | 9/2011 | Sano | |
| 2011/0298872 A1 | 12/2011 | Hayashi | |

FOREIGN PATENT DOCUMENTS

| | | |
|---|---|---|
| JP | 7-156376 | 6/1995 |
| JP | 2000-117973 | 4/2000 |
| JP | 2005-246961 | 9/2005 |
| JP | 2009-6603 | 1/2009 |
| JP | 2009-101543 | 5/2009 |
| JP | 2010-201785 | 9/2010 |
| JP | 2011-20297 | 2/2011 |

* cited by examiner

Primary Examiner — Matthew Luu
Assistant Examiner — Erica Lin
(74) Attorney, Agent, or Firm — Cooper & Dunham LLP

(57) ABSTRACT

A liquid discharge head includes a piezoelectric actuator. The piezoelectric actuator includes a piezoelectric member on which plural piezoelectric poles are formed, and the plural piezoelectric poles are formed to be inclined in a direction in which the plural piezoelectric poles are arranged.

13 Claims, 23 Drawing Sheets

LIQUID DISCHARGE HEAD, METHOD OF MANUFACTURING LIQUID DISCHARGE HEAD, AND IMAGE FORMING DEVICE

BACKGROUND OF THE INVENTION

1. Field of the Invention

Embodiments of the present invention relate to a piezoelectric actuator, a method of manufacturing the piezoelectric actuator, a liquid discharge head, a method of manufacturing the liquid discharge head, and an image forming device.

2. Description of the Related Art

As an image forming device such as a printer, a facsimile machine, a copier, a plotter, or a combined machine thereof, an image forming device (an ink jet recording device) of a liquid discharge recording type that utilizes a recording head including a liquid discharge head (a liquid droplet discharge head) that discharges an ink droplet is known. The image forming device of the liquid discharge recording type forms an image (recording, typing, imaging, and printing are used as synonyms) by discharging ink droplets from the recording head onto a sheet being conveyed. Here, the sheet is not limited to a paper, but includes an OHP and the like. The sheet means something to which an ink droplet or another liquid can be adhered. It may be referred to as a medium to be recorded on, a recording medium, a recording paper, or a recording sheet. There are two types of the image forming devices of the liquid discharge recording type. Namely, one of them is an image forming device of serial type, in which a recording head forms an image when the recording head moves in the main scanning direction while discharging liquid droplets. The other one is an image forming device of line type which utilizes a line-type head.

In the present specification, the image forming device of liquid discharge recording type is a device which forms an image by discharging a liquid onto a medium, such as a paper, a line, a fiber, a fabric, a leather, a metal, a plastic, a glass, a timber, or a seramic. Further, "forming an image" means not only to add an image having a meaning, such as a character or a graphic, to a medium, but also to add an image having no meaning, such as a pattern, to a medium (simply to apply liquid droplets to the medium). Further, "an ink" means not only a usual ink, but is also a generic term of a liquid with which an image can be formed, such as a recording liquid, a fixing liquid, or a fluid. For example, a DNA sample, a resist, a pattern material, and a resin are included in "inks." Further, "an image" means not only a two-dimensional image, but also an image attached to something which is formed three-dimensionally and an image which is formed three-dimensionally.

As a liquid discharge head, a so-called piezoelectric type head is known. Here, the piezoelectric type head includes a piezoelectric body as a pressure generating means that applies pressure to an ink, that is, for example, a liquid inside a liquid chamber, and, especially, a piezoelectric actuator in which plural piezoelectric elements (piezoelectric poles) are formed by grooving a laminated piezoelectric member in which piezoelectric layers and internal electrodes are alternately laminated. The piezoelectric type head causes an oscillation plate, which can be elastically deformed and which forms a wall surface in the liquid chamber, to be deformed by a displacement of a laminated piezoelectric element in d33 direction or in d31 direction; causes volume and pressure inside the liquid chamber to vary; and discharges liquid droplets (cf. Patent Document 1 (Japanese Published Unexamined Application No. 2010-201785)).

In such a piezoelectric type head, the piezoelectric poles and a driving circuit are connected by a flexible wiring substrate, such as a FPC, on which wiring electrodes corresponding to the piezoelectric poles are formed, so as to apply driving currents to the piezoelectric poles. Therefore, when the density is to be increased by reducing an arrangement pitch of the piezoelectric poles, reliability of the connection between the piezoelectric poles and the flexible wiring substrate may need to be ensured.

In order to ensure the reliability of the connection between the piezoelectric poles and the flexible wiring substrate, connecting areas may required to be broadened. However, in accordance with the increase of the density, the piezoelectric poles become thinner. Thus it is difficult to broaden the connecting areas. Further, since a distance between the neighboring piezoelectric poles is narrower, shorts between the neighboring piezoelectric poles and between the neighboring wiring electrodes become problems. Especially, since an accumulated pitch error in the arrangement direction of the wiring electrodes of the flexible wiring substrate formed with a resin material varies depending on processing accuracy or a storage environment, a positional shift error on the position, at which the piezoelectric pole and the wiring electrode are connected, occurs, and a short is more likely to be occurred.

Conventionally, it is known that, in order to prevent a short between the neighboring piezoelectric poles from occurring, solder joint portions between the piezoelectric poles and the wiring electrodes are arranged in a staggered fashion. With this arrangement, even if the solder flows out, pieces of the solder flowing out from the neighboring electrodes do not make contact (cf. Patent Document 2 (Japanese Published Unexamined Application No. H07-156376)).

Further, a configuration is known such that an effective width of a conductive pattern at a connecting portion of a flexible tape is set to be greater than a width of a piezoelectric oscillator, and a non-overlapping area that does not overlap with the conductive pattern is provided at a connecting portion of the piezoelectric oscillator. With such a configuration, an excessive amount of the solder melted at the time of connecting the conductive pattern is released to the non-overlapping area (cf. Patent Document 3 (Japanese Published Unexamined Application No. 2000-117973)).

In an image forming device, in order to form a higher quality image, the size of liquid droplets is reduced and nozzles are more densely formed. Further, in order to handle a higher processing speed, a higher frequency is used for a driving frequency, and a head, such as the line-type head, is lengthened in accordance with an increase of the number of the nozzles per head.

In order to accept higher integration, such as the increased density of the nozzles, the piezoelectric poles, as piezoelectric actuators which greatly affect a droplet discharging characteristic, may be required to be highly integrated. Further, when a laminated piezoelectric element is used, in order to ensure a desired displacement amount, a separation groove may be required to be deepened, namely, heights of the piezoelectric poles may be required to be increased. Thus, there is a problem that the piezoelectric poles that are evenly spaced apart at a fine pitch and that have a high aspect ratio may be required to be formed.

Further, when the piezoelectric poles are formed by grooving the laminated piezoelectric element, if the piezoelectric poles are densely produced, stiffness of the piezoelectric poles is decreased. Thus the piezoelectric poles are deformed by a processing load and the piezoelectric poles tend to be inclined. Therefore, the inclined piezoelectric poles and the wiring electrodes, which are arranged in parallel, may be required to be connected.

It has been found that, when the piezoelectric poles are inclined, a short between the neighboring piezoelectric poles may occur, even if the configuration disclosed in Patent Document 2 is applied. Further, for the configuration disclosed in Patent Document 3, there is a problem that, since a substantial pattern width (a width of the wiring electrodes) is increased, the configuration may not be applied for connecting the densely arranged piezoelectric poles and the wiring electrodes.

Embodiments of the present invention have been developed in view of the above described problems. An objective of the embodiments is to achieve a higher integration of piezoelectric poles, which are evenly spaced apart at a fine pitch, and which have a high aspect ratio.

Further, it is an objective of the embodiments to prevent a failure, such as a short, from occurring, even if the piezoelectric poles are inclined or there is an error in the pitch of wiring electrodes of a flexible wiring substrate.

SUMMARY OF THE INVENTION

In one aspect, there is provided a piezoelectric actuator including a piezoelectric member on which plural piezoelectric poles are formed, wherein the plural piezoelectric poles are formed to be inclined to a direction in which the plural piezoelectric poles are arranged.

Here, the inclinations of the piezoelectric poles may be constant.

In the piezoelectric actuator, plural of the piezoelectric poles may be formed from a laminated piezoelectric element in which piezoelectric material layers and internal electrode layers are laminated, and the piezoelectric poles may be formed to be inclined with respect to a direction which is perpendicular to the internal electrode layers.

Further, in the piezoelectric actuator, each of the piezoelectric poles may be formed such that, in a direction which is perpendicular to the direction in which the piezoelectric poles are arranged, an inclination amount of the piezoelectric pole varies along a direction from a first side of a first end portion of the piezoelectric pole to a second side of a second end portion of the piezoelectric pole.

Further, in the piezoelectric actuator, a feed member for transmitting driving signals to the corresponding piezoelectric poles may be connected to the piezoelectric member. The feed member may include wiring electrodes which are connected to corresponding electrodes of the piezoelectric poles, and each of the wiring electrodes of the feed member may be formed such that at least a portion of the wiring electrode which is joined to the corresponding electrode of the piezoelectric pole is inclined to the direction in which the piezoelectric pole is inclined.

Further, in the piezoelectric actuator, a feed member for transmitting driving signals to the corresponding piezoelectric poles may be connected to the piezoelectric member. The feed member may include wiring electrodes which are connected to electrodes of the corresponding piezoelectric poles, and the feed member may be connected to the piezoelectric member while the entirety of the feed member may be inclined in the direction in which the piezoelectric poles are inclined.

With the piezoelectric actuator, the plural piezoelectric poles are formed to be inclined to the direction in which the piezoelectric poles are arranged. Thus, a direction of a load during groove processing can be regulated to be in a constant direction, and the piezoelectric poles having a high aspect ratio can be evenly spaced apart at a fine pitch. Therefore, a higher integration may be achieved.

In another aspect, there is provided a method of manufacturing a piezoelectric actuator, wherein the piezoelectric actuator includes a piezoelectric member on which plural piezoelectric poles are formed, and wherein the plural piezoelectric poles are formed to be inclined to a direction in which the plural piezoelectric poles are arranged by forming plural grooves on the piezoelectric member with a dicing blade such that a first resistance on a first surface of the dicing blade is different from a second resistance on a second surface of the dicing blade.

With the method of manufacturing the piezoelectric actuator, the plural piezoelectric poles are formed to be inclined to the direction in which the piezoelectric poles are arranged, by groove processing the piezoelectric member using the dicing blade whose surfaces have different resistances.

Therefore, piezoelectric poles having a high aspect ratio can be evenly spaced apart at a fine pitch, and a highly integrated piezoelectric actuator can be obtained.

In another aspect, there is provided a liquid discharge head including a piezoelectric actuator, wherein the piezoelectric actuator includes a piezoelectric member on which plural piezoelectric poles are formed, and wherein the plural piezoelectric poles are formed to be inclined to a direction in which the plural piezoelectric poles are arranged.

With the liquid discharge head, since the liquid discharge head includes the above described piezoelectric actuator, a high density head can be obtained.

In another aspect, there is provided an image forming device including a liquid discharge head, wherein the liquid discharge head includes a piezoelectric actuator, wherein the piezoelectric actuator includes a piezoelectric member on which plural piezoelectric poles are formed, and wherein the plural piezoelectric poles are formed to be inclined to a direction in which the plural piezoelectric poles are arranged.

With the image forming device, since the image forming device includes the above described liquid discharge head, a high-quality image can be formed.

In another aspect, there is provided a liquid discharge head including a piezoelectric member on which plural piezoelectric poles are formed; and a flexible wiring substrate on which wiring electrodes are formed, the wiring electrodes being connected to the corresponding piezoelectric poles. The piezoelectric poles are formed to be inclined to the direction in which the piezoelectric poles are arranged, the wiring electrodes on the flexible wiring substrate are joined to electrodes of the corresponding piezoelectric poles, and a joining portion of each of the wiring electrodes, which joins the wiring electrode to the electrode of the corresponding piezoelectric pole, is formed such that a width of the joining portion, in a direction in which the plural piezoelectric poles are arranged, narrows along a direction from a top end portion of the corresponding piezoelectric pole to a base end portion of the corresponding piezoelectric pole.

In the liquid discharge head, the piezoelectric poles may be formed to be inclined to the direction in which the piezoelectric poles are arranged.

Further, in the liquid discharge head, an inclination angle of the joining portion, the joining portion width being narrowed, may be smaller than an inclination angle of the corresponding piezoelectric pole.

With the liquid discharge head, since the portion of the wiring electrode, which joins the wiring electrode of the flexible wiring substrate to the piezoelectric pole, is configured such that the width of the wiring electrode in the direction in which the piezoelectric poles are arranged becomes narrower, along a direction from the top end side of the piezoelectric pole to the base end side of the piezoelectric pole, an occurrence of a failure, such as a short, can be prevented, even if there is an error in the inclinations of the piezoelectric poles or an error in the pitch of the wiring electrodes of the flexible wiring substrate.

In another aspect, there is provided a liquid discharge head including a piezoelectric member on which plural piezoelectric poles are formed; and a flexible wiring substrate on which wiring electrodes are formed, the wiring electrodes being connected to the corresponding piezoelectric poles. The wiring electrodes on the flexible wiring substrate are joined to electrodes of the corresponding piezoelectric poles, and a joining portion of each of the wiring electrode, which joins the wiring electrode to the corresponding electrode of the piezoelectric pole, is formed in a rhombus shape.

In the liquid discharge head, a width of the joining portion of each of the wiring electrodes at a base end side of the corresponding piezoelectric pole in the direction, in which the plural piezoelectric poles are arranged, may be less than a thickness of the wiring electrode.

Further, in the liquid discharge head, the piezoelectric poles and the wiring electrodes may be joined by a solder; a length of the joining portion of each of the wiring electrodes, which joins the wiring electrode to the corresponding piezoelectric pole, may be less than a length of the corresponding piezoelectric pole, and the solder may flow to a top end portion of the corresponding electrode of the piezoelectric pole.

With the liquid discharge head, since the joining portion of the wiring electrode, which joins the wiring electrode of the flexible wiring substrate to the piezoelectric pole, is formed in a rhombus shape, an occurrence of a failure, such as a short, can be prevented, even if there is an error in the inclinations of the piezoelectric poles or an error in the pitch of the wiring electrodes of the flexible wiring substrate.

In another aspect, there is provided an image forming device including a liquid discharge head. The liquid discharge head includes a piezoelectric member on which plural piezoelectric poles are formed; and a flexible wiring substrate on which wiring electrodes are formed, the wiring electrodes being connected to the corresponding piezoelectric poles. The wiring electrodes on the flexible wiring substrate are joined to corresponding electrodes of the piezoelectric poles, and a joining portion of each of the wiring electrodes, which joins the wiring electrode to the corresponding electrode of the piezoelectric pole, is such that a width of the joining portion in a direction, in which the plural piezoelectric poles are arranged, is narrowing, along a direction from a side of a top end portion of the corresponding piezoelectric pole to a side of a base end portion of the corresponding piezoelectric pole.

With the image forming device, since the image forming device includes the above described liquid discharge head, a high-quality image can be formed.

In another aspect, there is provided a method of manufacturing a liquid discharge head, the liquid discharge head including a piezoelectric member on which plural piezoelectric poles are formed; and a flexible wiring substrate on which plural wiring electrodes are formed. The plural wiring electrodes are joined to corresponding electrodes of the piezoelectric poles by a solder. When the flexible wiring substrate including the plural wiring electrodes, the wiring electrodes being coated by the solder in advance, is irradiated by laser beams, and the solder is melted and each of the wiring electrodes is joined to the electrode of the corresponding piezoelectric pole, the laser beams are irradiated to a portion of the wiring electrode which is coated by the solder and to a top end portion of the electrode of the piezoelectric pole.

With the method of manufacturing the liquid discharge head, since the laser beams are irradiated to the area where the wiring electrode of the flexible wiring substrate is coated with the solder and to the top end port portion of the electrode of the piezoelectric pole, the solder is melted and spread to form a fillet across the electrode of the piezoelectric pole. Therefore, the solder ball is not formed, and the reliability of the joining can be improved.

Other objects, features and advantages of the present invention will become more apparent from the following detailed description when read in conjunction with the accompanying drawings.

DETAILED DESCRIPTION OF THE PREFERRED EMBODIMENTS

Figure 1:
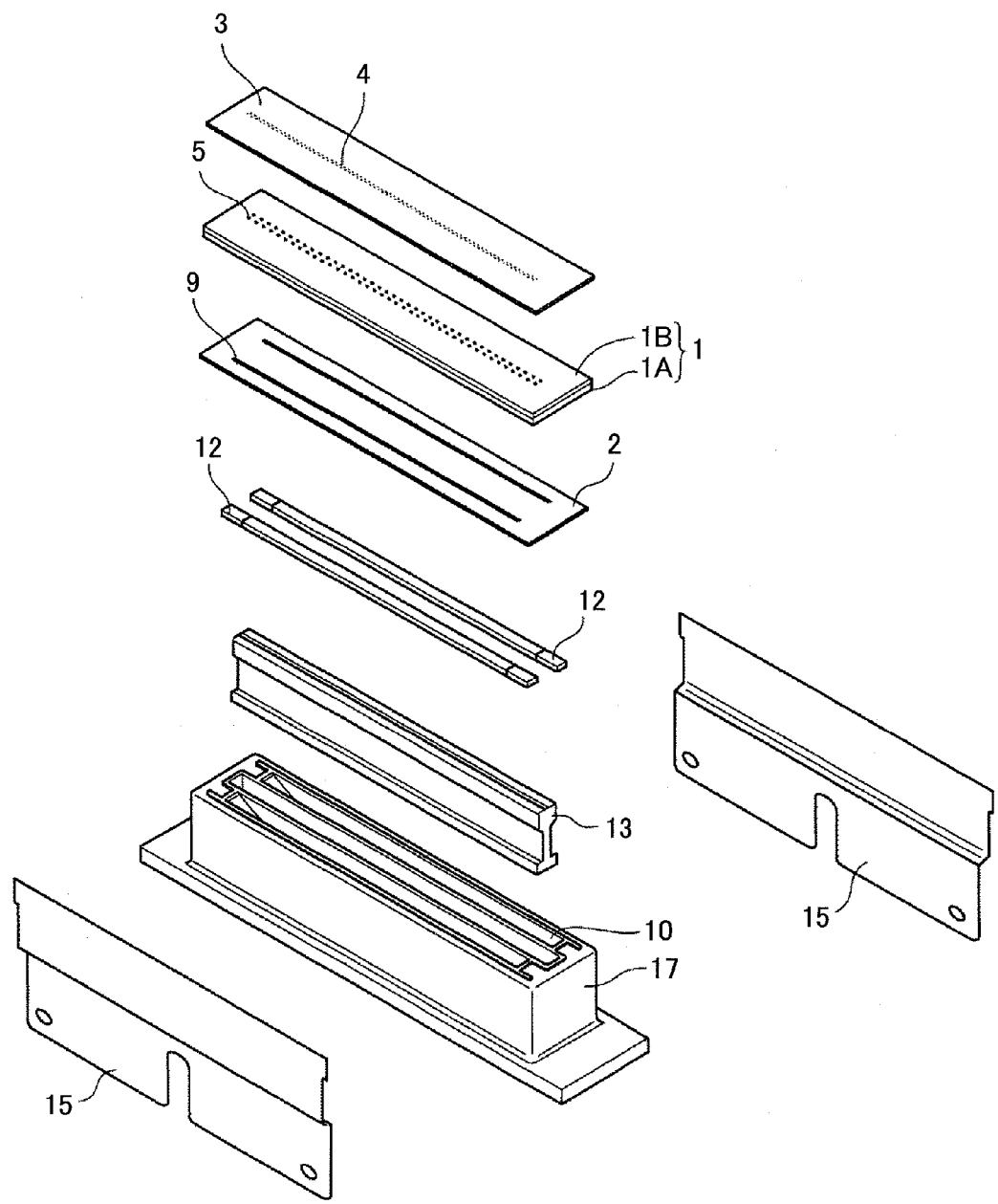
FIG. 1 is an exploded perspective view illustrating an example of a liquid discharge head.
Figure 2:
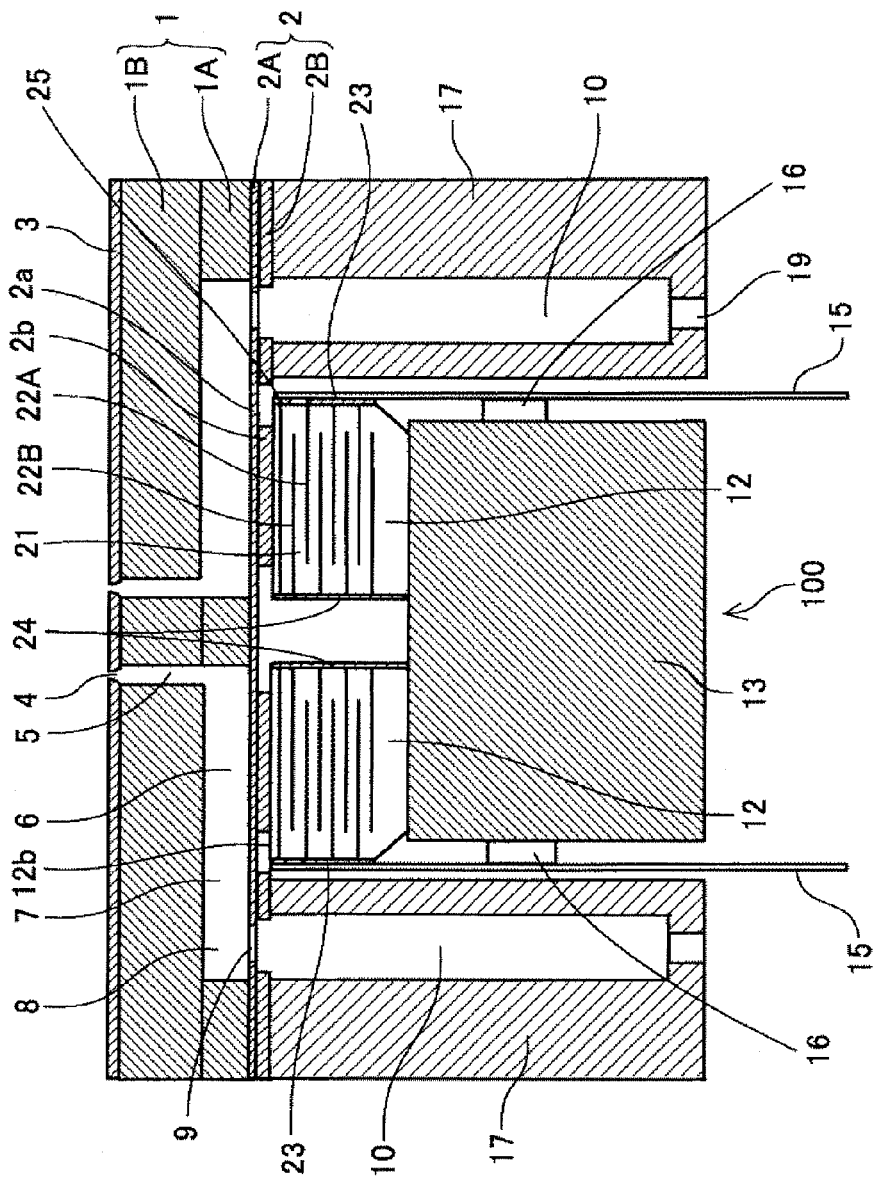
FIG. 2 is a sectional explanatory diagram along a longitudinal direction of a liquid chamber of the liquid discharge head.
Figure 3:
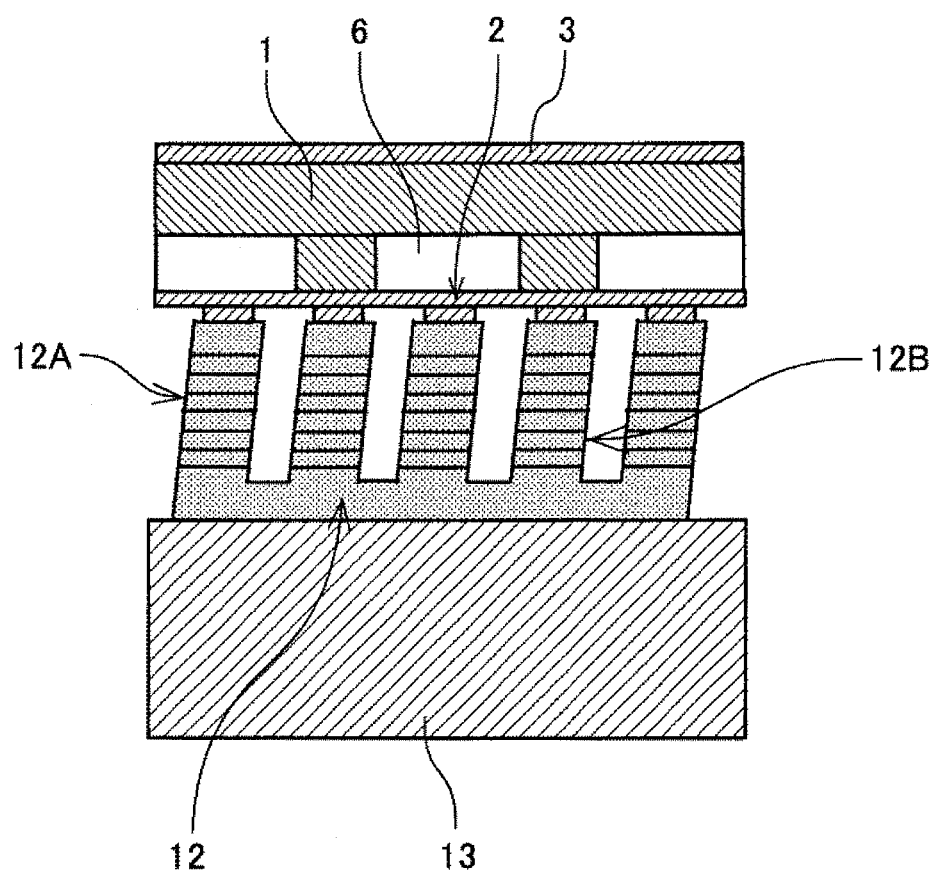
FIG. 3 is a sectional explanatory diagram along a short direction of an example of the liquid chamber of the liquid discharge head.
Figure 4:
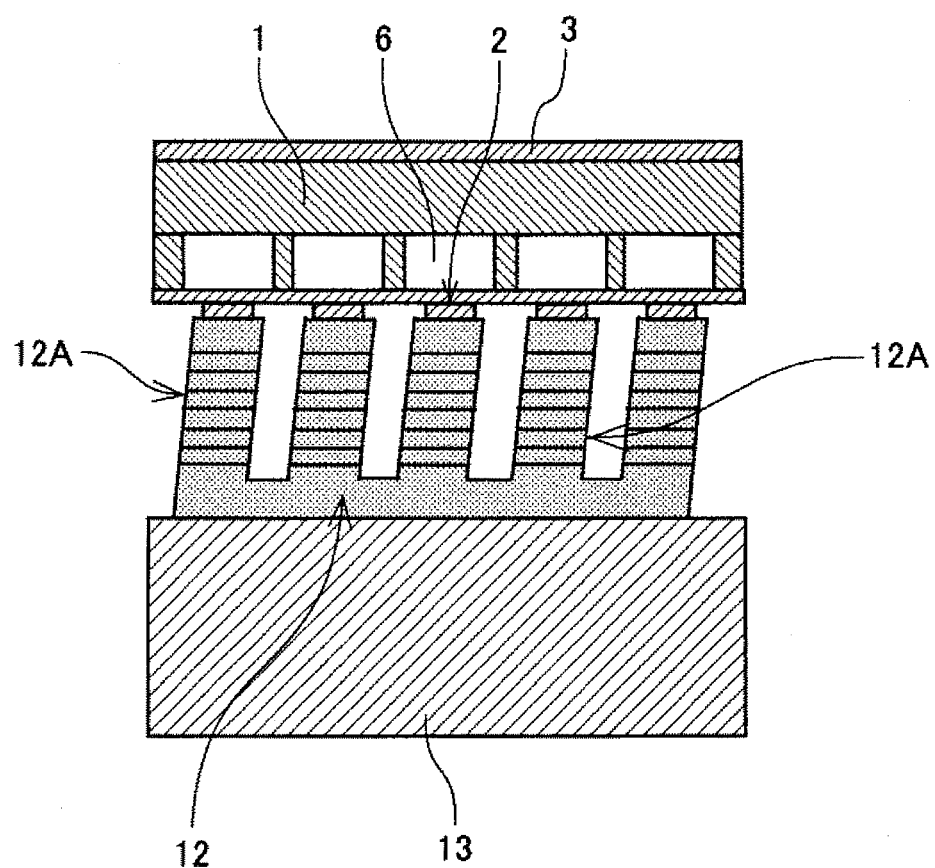
FIG. 4 is a sectional explanatory diagram along a short direction of another example of the liquid chamber of the liquid discharge head.

Hereinafter, embodiments of the present invention are explained by referring to figures. An example of a liquid discharge head is explained by referring to FIGS. 1-4. Here, FIG. 1 is an exploded perspective view illustrating the liquid discharge head. FIG. 2 is a sectional explanatory diagram along a direction (a longitudinal direction of a liquid chamber) which is perpendicular to a direction in which nozzles of the liquid discharge head are arranged. FIGS. 3 and 4 are two different sectional explanatory diagrams along the direction in which the nozzles of the liquid discharge head are arranged.

The liquid discharge head includes a fluid channel board (also referred to as a fluid channel substrate or a liquid chamber substrate) 1, a vibration plate member 2 which forms a vibration plate connected to a bottom surface of the fluid channel board 1, and a nozzle board 3 which is connected to an upper surface of the fluid channel 1. With these elements, plural liquid chambers (also referred to as a compression liquid chamber, a pressure chamber, a compression chamber, or a fluid channel) 6, plural fluid resistance portions 7 which also server as supply channels for supplying ink to the corresponding liquid chambers, and plural communication units 8 which communicate with the corresponding liquid chambers 6 through the corresponding fluid resistance portions 7 are formed as individual fluid channels which communicate with corresponding nozzles 4, which discharge liquid droplets, through corresponding nozzle communication channels 5. The ink is supplied to the communication units 8 from a common liquid chamber 10 which is formed in a frame member 17 (described later) through supply ports 9, which are formed on the vibration plate member 2.

The fluid channel board 1 includes a fluid channel board 1A and a communication board 1B, which are bonded together. For the fluid channel board 1A, a SUS substrate is etched with an acid etching liquid or is machine processed, such as being punch processed (press processed), and the ports, such as the communication channels 5, the compression liquid chambers 6, and the fluid resistance portions 7, are formed.

The vibration plate member 2 is formed with a first layer 2A and a second layer 2B. A thin portion is formed with the first layer 2A and a thick portion is formed with the first layer 2A and the second layer 2B. The vibration plate member 2 includes plural vibration areas (diaphragm portions) 2a formed with the first layer 2A, which forms wall surfaces corresponding to the liquid chambers 6. Within each vibration area 2a, an insular convex portion 2b, which is formed with the thick portion of the first layer 2A and the second layer 2B, is arranged on an outer side of the surface (an opposite surface side with respect to the liquid chamber 6). For the insular convex portions 2b, a piezoelectric actuator 100 according to the embodiment of the present invention, which includes an electromechanical transducer as a driving means (an actuator means, a pressure generating means) that causes the vibration areas 2a to be deformed, is attached.

The piezoelectric actuator 100 includes plural (here, two) laminated piezoelectric members 12 which are adhesively bonded on a base member 13. Each piezoelectric member 12 is processed to form grooves 113 by half-cut dicing. For each piezoelectric member 12, a required number of piezoelectric poles 12A and 12B are shaped in a comb-tooth shape. Here, the piezoelectric poles 12A and 12B are evenly spaced apart by a predetermined distance. The piezoelectric poles 12A and the piezoelectric poles 12 B of each piezoelectric member 12 are the same. However, they are distinguished such that the piezoelectric poles that are driven by applying a driving waveform are referred to as the driving piezoelectric poles 12A, and the piezoelectric poles to which no driving waveform is applied and which are merely used as supports are referred to as non-driving piezoelectric poles 12B. Upper surfaces (bonding surfaces) of the driving piezoelectric poles 12A are joined to the corresponding insular convex portions 2b of the vibration plate member 2.

Here, the piezoelectric member 12 is formed by alternately laminating piezoelectric material layers 21 and internal electrodes 22A and 22B. The internal electrodes 22A are extended toward one of side surfaces which are perpendicular to the vibration plate member 2 of the piezoelectric member 12, and the internal electrodes 22A are connected to a side surface electrode (external electrode) 23, which is formed on the one of the side surfaces. Similarly, the internal electrodes 22B are extended toward the other one of the side surfaces which are perpendicular to the vibration plate member 2 of the piezoelectric member 12, and the internal electrodes 22B are connected to a side surface electrode (external electrode) 24, which is formed on the other one of the side surfaces. When a voltage is applied between the side surface electrodes (external electrodes) 23 and 24, a displacement in a lamination direction occurs.

Further, to the piezoelectric member 12, an FPC 15, which is a flexible wiring substrate, is connected as a flexible feed member (wiring member) for supplying a driving signal to the driving piezoelectric poles 12A. It is not indicated in the figures, but a driver IC (a driving circuit) that supplies a driving waveform (a driving signal) to the driving piezoelectric poles 12A is mounted on the FPC 15. The FPC 15 is fixed to the base member 13 with a hot melt adhesive.

Here, as described above, the piezoelectric poles 12A and 12B of the piezoelectric member 12 are the same. The piezoelectric poles that are driven by applying the driving waveform are the driving piezoelectric poles 12A. The piezoelectric poles to which no driving waveform is applied and which are merely used as supports are the non-driving piezoelectric poles 12B. As shown in FIG. 3, the driving piezoelectric poles 12A and the non-driving piezoelectric poles 12B are alternately used. However, as shown in FIG. 4, all the piezoelectric poles may be used as the driving piezoelectric poles 12A.

The nozzle board 3 is formed from a metal plate of nickel (Ni). The nozzle board 3 is manufactured by an electroforming method (electromolding). On the nozzle board 3, the nozzles 4 of diameter ranging from 10 to 35 μm are formed corresponding to the liquid chambers 6. The nozzle board 3 is adhesively bonded to the fluid channel board 1. On a side of the nozzle board 3, from which the liquid droplets are discharged (a surface in a discharging direction: a discharging surface, or a surface opposite to the liquid chamber 6), a water-shedding layer is formed.

Further, the frame member 17 is joined to an outer circumference of the actuator portion including the piezoelectric element 12, the base member 13, and the FPC 15. The frame member 17 is formed by injection molding with an epoxy resin or polyphenylene sulfide. The above described common liquid chamber 10 is formed in the frame member 17, and a supply port 19 for supplying a recording liquid from the outside to the common liquid chamber 10 is formed on the frame member 17. The supply port 19 is connected to an ink supply source, such as a sub-tank or an ink cartridge, which is not shown in the figures.

In the liquid discharge head configured in this manner, for example, when the driving piezoelectric poles 12A are driven by a push-out method, driving pulse voltages of from 20 to 50 V from a control unit (which is not shown in the figures) are selectively applied to the driving piezoelectric poles 12A, depending on an image to be recorded. Then the driving piezoelectric poles 12A, to which the pulse voltage is applied, are displaced. The displacements of the driving piezoelectric poles 12A cause the vibration areas 2a of the vibration plate member 2 to be deformed toward the nozzle board 3. When the volume of the individual liquid chamber 6 is varied, pressure is applied to the ink within the liquid chamber 6 and liquid droplets are discharged from the nozzle 4 of the nozzle board 3. Then, in accordance with discharging of the liquid droplets, the pressure within the liquid chamber 6 is reduced. At this time, a small negative pressure is generated within the liquid chamber 6 by inertia of liquid flow. Under this condition, when the application of the voltages to the piezoelectric poles 12A is stopped, the vibration plate member 2 returns to its original position and the shape of the liquid chamber 6 becomes the original shape. Thus, a further negative pressure is generated. At this time, the ink is supplied from the common liquid chamber 10 to the liquid chamber 6. Then liquid droplets are discharged from the nozzle 4 in response to an application of a next driving pulse.

Further, the liquid discharge head may be driven by a pull-out method (a method in which the vibration plate member 2 is released from a pulled state and the liquid chamber 6 is pressed by a restoring force) or a pull-push-out method (a method in which the vibration plate member 2 is retained at an intermediate position, and after pulling the vibration plate member 2 from this position, the vibration plate member 2 is pushed), in addition to the above described push-out method.

Figure 5:
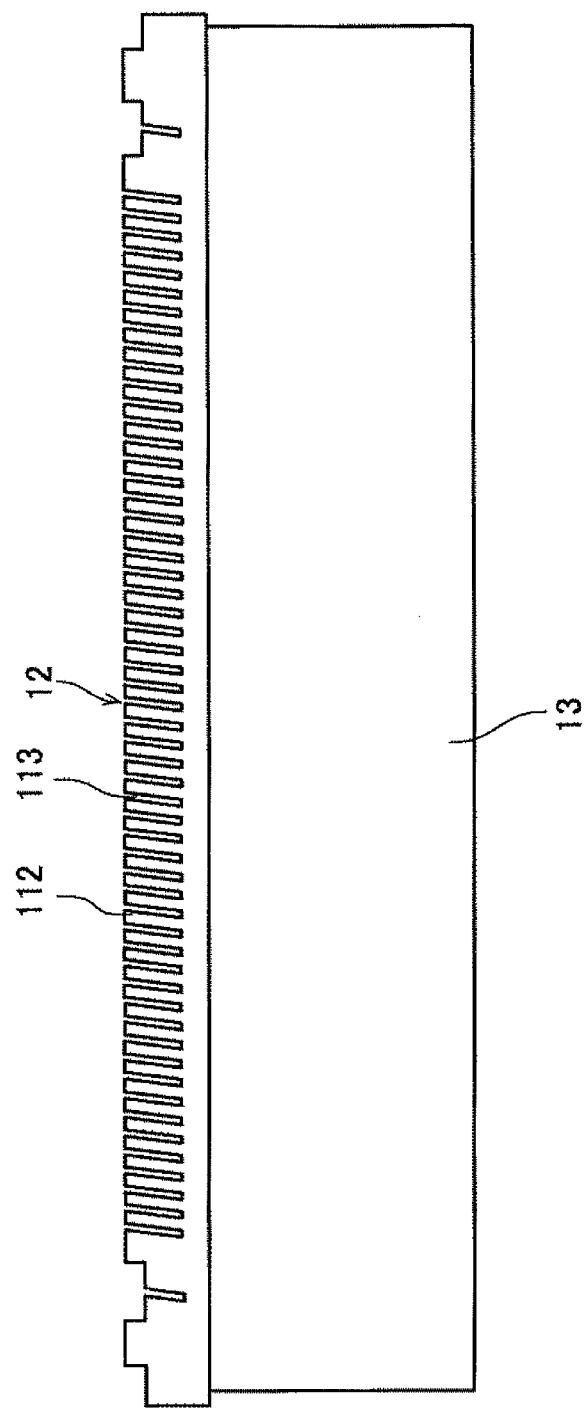
FIG. 5 is a front explanatory diagram of a first embodiment of the piezoelectric actuator.
Figure 6:
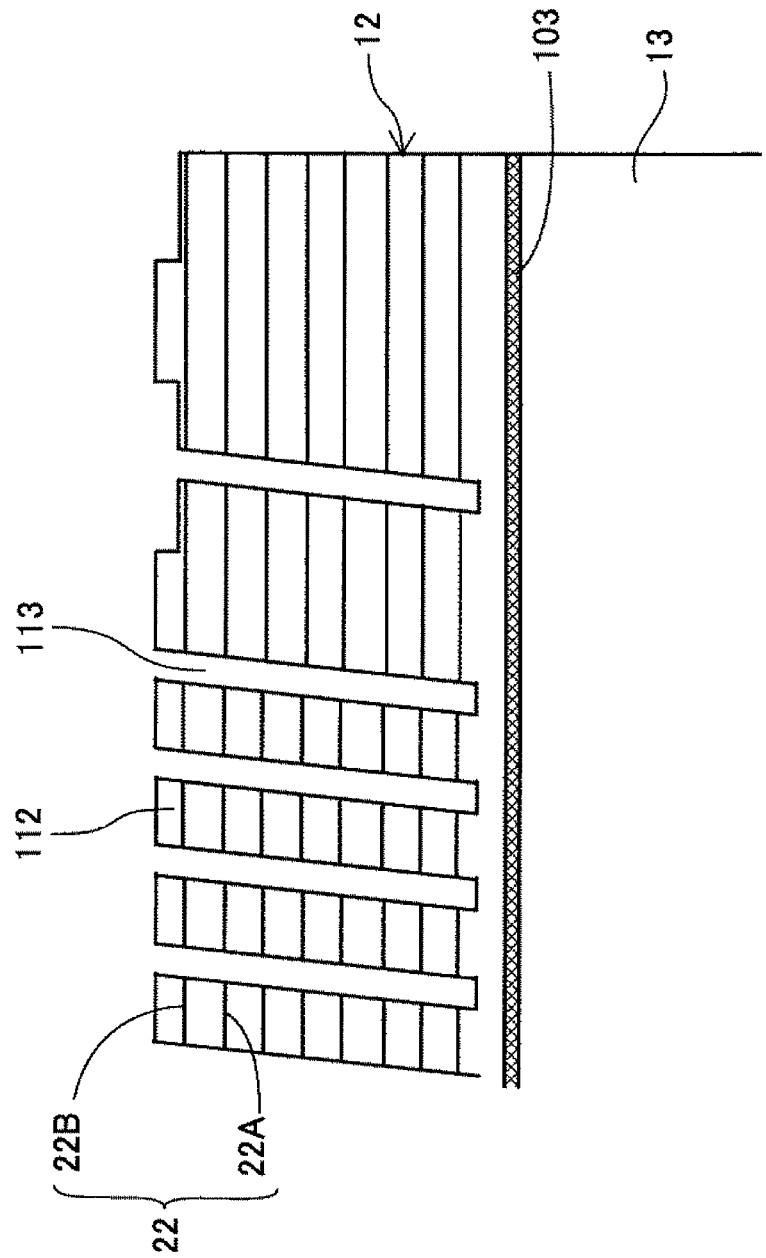
FIG. 6 is a diagram magnifying and illustrating major portions of FIG. 5.

Next, in a first embodiment of the present invention, a piezoelectric actuator 100 is explained by referring to FIGS. 5 and 6. Here, FIG. 5 is a front view illustrating the piezoelectric actuator. FIG. 6 is a diagram magnifying a major portion of FIG. 5 and illustrating the piezoelectric actuator. In this piezoelectric actuator, the two piezoelectric members 12 (see FIG. 8) are arranged in parallel on the base member 13, made of such as SUS430, and the two piezoelectric members 12 are adhesively fixed to the base member 13 with an acrylic anaerobic adhesive 103. On the piezoelectric member 12, plural piezoelectric poles 112 (used as a generic term including the driving piezoelectric poles 12A and the non-driving piezoelectric poles 12B) are formed by the grooves 113.

Here, the plural piezoelectric poles 112 of the piezoelectric member 12 are formed while the plural piezoelectric poles 112 are inclined to a direction in which the piezoelectric poles are arranged (a direction in which the nozzles are arranged). The piezoelectric poles 112 are inclined at a constant angle from a base end portion (a bottom side of the groove 113) to a top end portion in a depth direction of the groove 113 (a height direction of the piezoelectric pole).

Incidentally, dimensions of the piezoelectric pole 112 are such that, for example, a width in the direction in which the piezoelectric poles are arranged is about 23 μm, and a height is about 360 μm. Further, an inclination amount (a shift amount between the base end portion and the top end portion of the piezoelectric pole 112 in the direction in which the piezoelectric poles are arranged) of the piezoelectric pole 112 is in a range of from 2 to 10 μm. It is preferable that a ratio of the inclination amount to the height of the piezoelectric pole be within a range of from 0.5% to 5%. If the inclination amount is too large, a direction of a force generated, when the piezoelectric pole 112 is displaced, is also inclined. Thus the efficiency of the deformation of the vibration plate 2 is degraded. Therefore, it is preferable that the inclination amount be less than or equal to 5%.

In order to form the piezoelectric poles 112 that are inclined in the direction in which the piezoelectric poles are arranged, a groove processing tool, such as a dicing blade, is also inclined so that the processed grooves 113 are inclined. Then a direction of a load applied to two surfaces of the groove processing tool can be fixed to a constant direction, and stability for processing the grooves can be improved. Therefore, the piezoelectric poles 112 can be prevented from collapsing.

Figure 7:
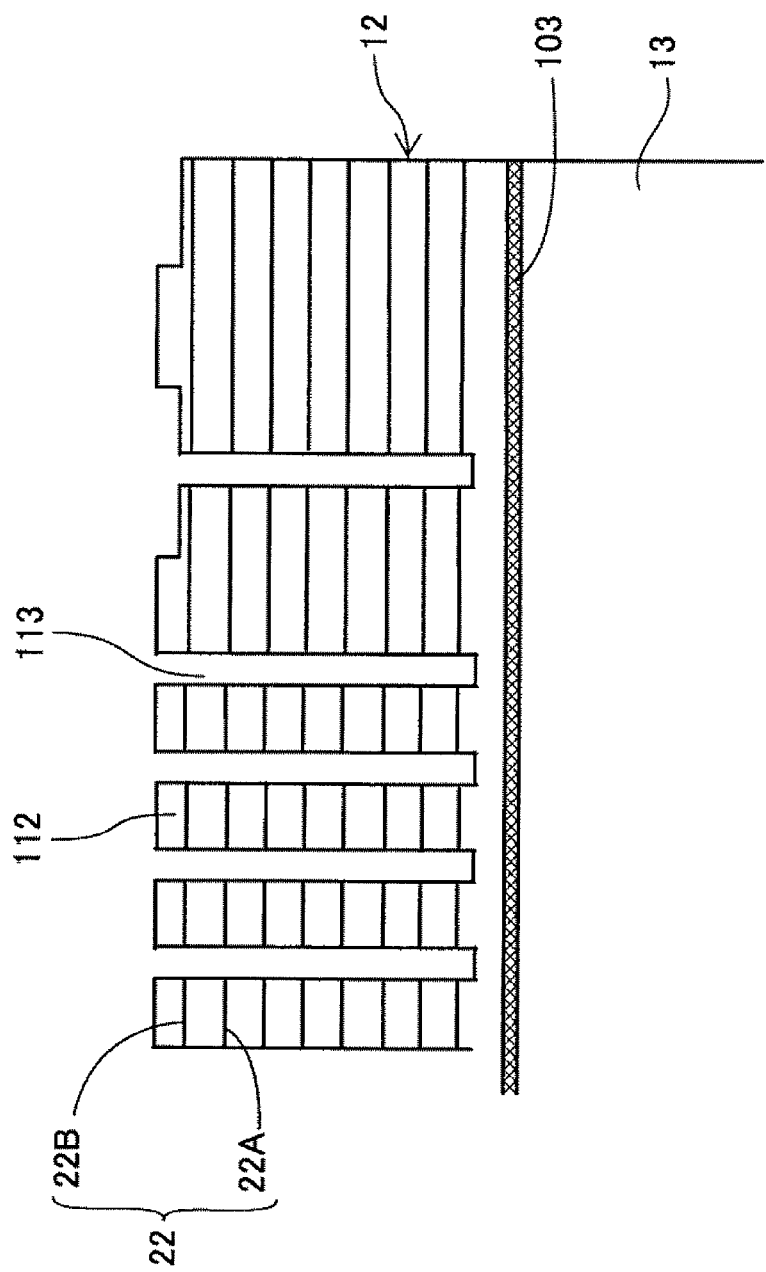
FIG. 7 is a diagram magnifying and illustrating a piezoelectric actuator of a comparative example.

Namely, as in a comparative example shown in FIG. 7, when the grooves 113 are perpendicularly formed (a direction perpendicular to the joint surface of the base member 13), the direction of the load applied to the two surfaces of the groove processing tool is varied by a variation of a cutting resistance or perturbations at a time of processing. Therefore, it is difficult to stably process, and consequently, the piezoelectric poles tend to collapse.

When the plural piezoelectric poles, which are inclined to the direction in which the piezoelectric poles are arranged, are formed, the direction of the load at a time of processing a groove can be regulated to be in a constant direction. Therefore, piezoelectric poles having a high aspect ratio can be evenly spaced apart at a fine pitch, and a higher integration can be achieved. Specifically, by processing grooves in an order that corresponds to an inclination direction (from right to left in FIG. 6), the load can be converged to a left side in the inclination direction, where grooves are not yet formed, and the load applied to the piezoelectric pole at the right side, which has already been formed, can be reduced. In this manner, a collapse of the piezoelectric pole 112 can be prevented, even if the piezoelectric poles 112 are evenly spaced at a fine pitch.

Further, when the inclinations of the piezoelectric poles 112 of the piezoelectric member 12 are set to be a constant inclination, the inclination of the processed groove 113 is also the constant inclination. In this manner, the groove 113 between the neighboring piezoelectric poles 112 can be set to have a constant width. Thus, a variation of the characteristics of the piezoelectric actuator (variation of forces to be generated) can be reduced. Furthermore, by setting the inclination directions of the piezoelectric poles 112 to a constant direction, the tolerance for the pitch of the wiring electrodes of the feed member 15 may be relaxed, when the feed member (for example, a FPC) 15, which may be required for providing a driving signal to the piezoelectric member 12, is joined.

Further, the piezoelectric member 12 is a laminated piezoelectric element, in which the piezoelectric material layers 21 and the internal electrodes 22A and 22B are laminated. The piezoelectric pole 112 is inclined with respect to a direction which is perpendicular to the internal electrodes 22A and 22B. When the piezoelectric pole 112 is constructed to be perpendicular to the internal electrodes 22A and 22B, as a conventional piezoelectric pole shown in FIG. 7, during processing of a groove, stress is applied in a direction to remove the internal electrodes (the direction which is perpendicular to the internal electrodes 22A and 22B), and the removal of the internal electrodes 22A and 22B leads to a collapse of the piezoelectric pole 112. On the other hand, when the piezoelectric pole 112 is constructed to be inclined as shown in FIG. 6, during processing of a groove, only a component of the stress in the direction which is perpendicular to the internal electrodes 22A and 22B is applied in the direction to remove the internal electrodes. Thus the removal of the internal electrodes can be prevented.

Figure 8:
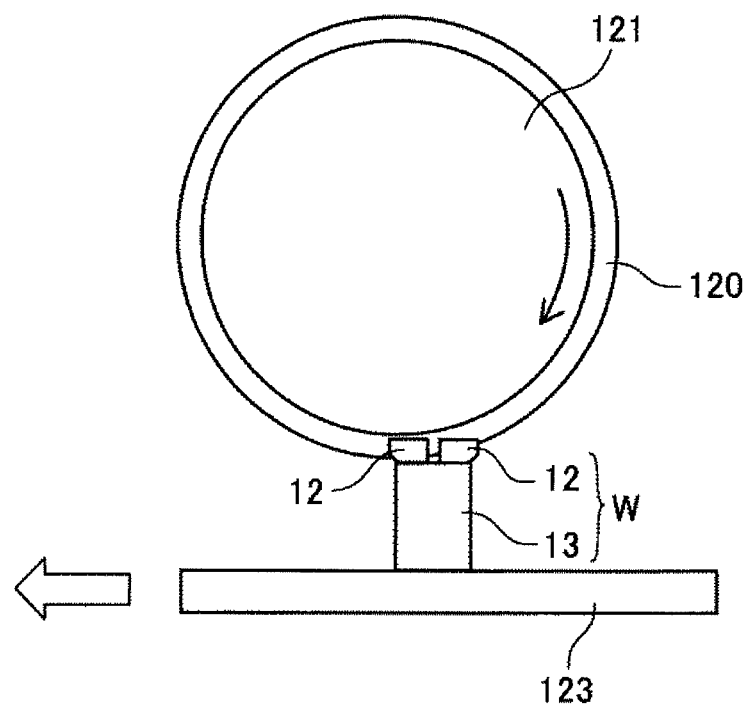
FIG. 8 is an explanatory diagram for explaining a processing state in a piezoelectric actuator manufacturing method according to the embodiment.
Figure 9:
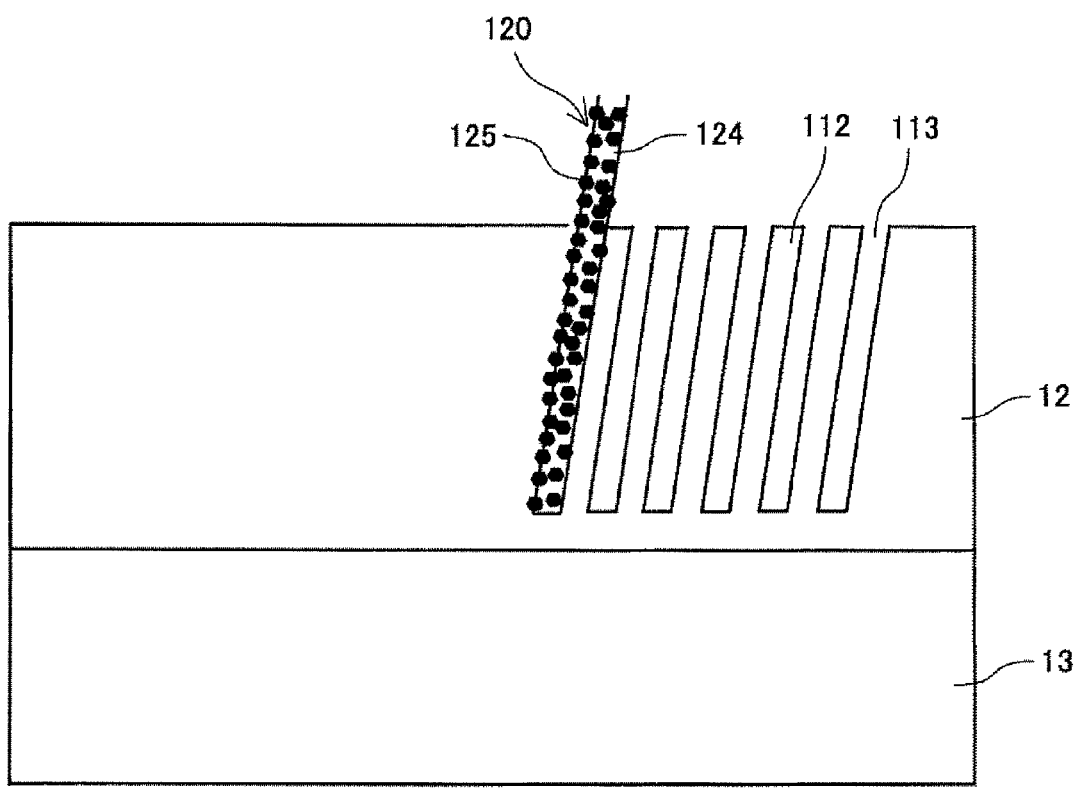
FIG. 9 is an explanatory diagram magnifying major portions of the piezoelectric actuator during the processing.

Next, a manufacturing method of the piezoelectric actuator 100 is explained by referring to FIGS. 8 and 9. Here, FIG. 8 is a diagram illustrating a processing state in the manufacturing method, and FIG. 9 is a diagram magnifying and illustrating a major portion during processing. A work piece W, in which the two piezoelectric members 12 are adhesively fixed to the base member 13, is fixed onto a stage 123. Then the stage 123 is moved to the linear direction of the first arrow in FIG. 8, and groove processing is applied to the piezoelectric members 12 using a dicing blade 120 which is attached to a flange 121 and rotates in the direction of the second arrow. In this manner the grooves 113 are formed and the plural piezoelectric poles 112 are formed on the piezoelectric members 12.

Here, as shown in FIG. 9, the dicing blade 120 is a so-called electroformed blade such that diamonds 125 are dispersed in nickel 124.

In order to form the inclined piezoelectric poles 112, the dicing blade 120 itself may be inclined and the groove processing may be performed.

However, in the manufacturing method of the piezoelectric actuator according to the embodiment, the number of the diamonds 125 which exist on a first surface and the number of the diamonds 125 which exist on a second surface of the dicing blade 120 are different. Thus, during processing, the resistance on the first surface and the resistance on the second surface are different. Therefore, the piezoelectric poles 112 are inclined.

In the example, as shown in FIG. 9, the amount of the diamonds 125 is greater at a downstream side in a pitch-forward direction (the left side in the figure) of the dicing blade 120. On the other hand, the amount of the diamonds 125 exposed on the surface of the dicing blade 120 is smaller at an upstream side in the pitch-forward direction.

When such a dicing blade 120 is used for processing, the cut amount is greater at the side where the exposure amount of the diamonds 125 is greater, even if the dicing blade 120 is arranged perpendicular to the surface of the piezoelectric member 12 during the processing. Therefore, during the processing, the blade is inclined and the process proceeds. As shown in FIG. 9, the groove 113, which has been formed, is inclined toward the side where the exposure amount of the diamonds 125 is greater. In this case, it is possible that the groove 113 is formed such that the inclination of the groove 113 is not linear but the inclination of the groove 113 becomes greater along the downward direction (toward the base end of the piezoelectric pole 112). However, such a structure has a similar effect.

When the dicing blade 120 is inclined and attached to the flange 121, since the direction of gravity is shifted from the direction of the centrifugal force that acts on the rotating dicing blade 120, it is possible that the dicing blade 120 is not stable. However, when the dicing blade 120 has the configuration such that the cutting resistance of one of the surfaces is different from the cutting resistance of the other surface, the rotation of the dicing blade 120 is stabilized. Thus the piezoelectric poles 112 can be easily processed to be inclined and to be evenly spaced apart at a finer pitch.

Further, when the inclination direction of the groove 113 is set to the pitch-forward direction, a force to separate the dicing blade 120 from the piezoelectric pole 112 being formed is generated during the processing. Therefore, the load applied to the piezoelectric pole 112 is reduced, and the collapse of the piezoelectric pole 112 can be prevented.

Further, as described above, by forming the plural piezoelectric poles, which are inclined in the direction in which the piezoelectric poles are arranged, the direction of the load during the processing can be regulated to be in a constant direction.

Figure 10:
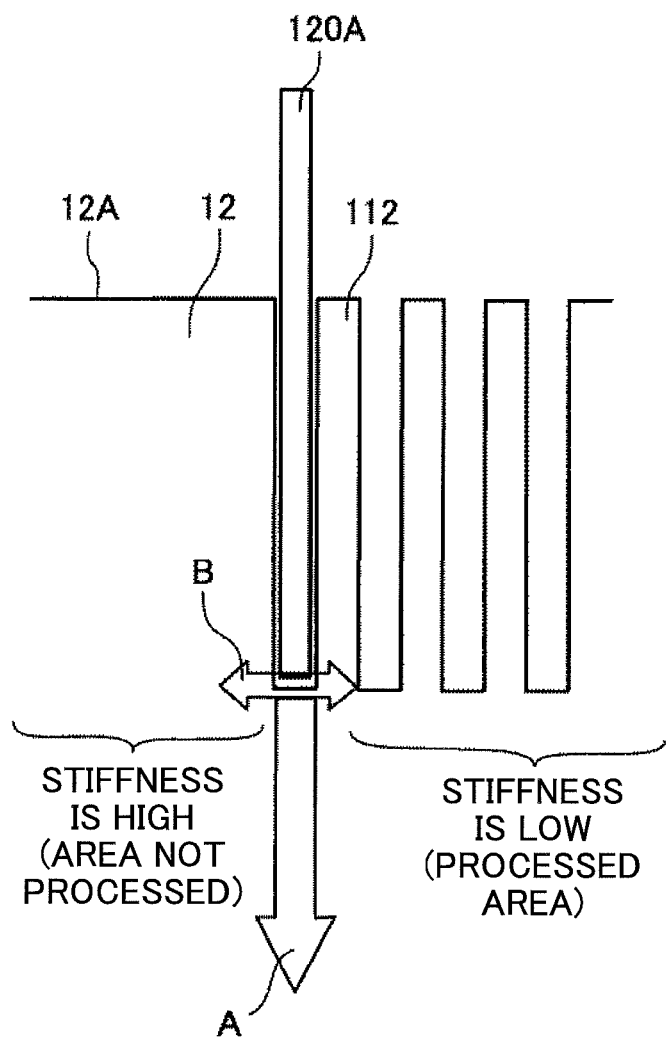
FIG. 10 is an explanatory diagram for explaining a processing method in a comparative example.

Namely, as in a comparative example shown in FIG. 10, when the piezoelectric pole 112 is perpendicularly formed without any inclination by using a dicing blade 120A such that there is no difference between the resistance of one of the surfaces and the resistance of the other surface, the dicing blade 120A performs the groove processing while the dicing blade 120A is perpendicular to the top surface 12A of the piezoelectric member 12 (the direction of the pressing force of the blade 120A is the direction of the arrow A). At this time, process loads caused by perturbations (in the directions of the arrows B) are evenly applied to an area where the stiffness is low (the area where the piezoelectric poles 112 have already been formed) and an area where the stiffness is high. When the process load is applied to the area where the stiffness is low (the area where the piezoelectric poles 112 have already been formed), the piezoelectric pole 112 tends to collapse.

Figure 11:
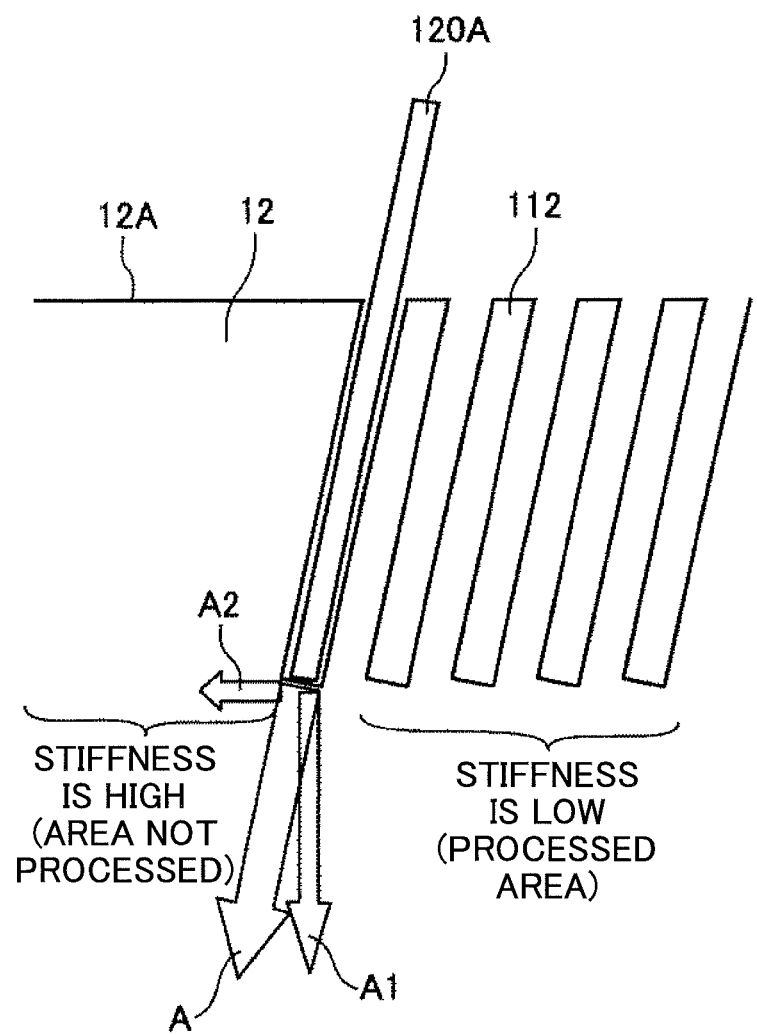
FIG. 11 is an explanatory diagram for explaining the processing method according to the embodiment.

On the other hand, as shown in FIG. 11, when the dicing blade 120A is inclined during the processing, the pressing force of the blade 120A (in the direction of the arrow A) is decomposed into a force A1 in the vertical direction and a force A2 in the horizontal direction (the forward direction). Thus the process load during the processing can be intentionally constrained within the area where the stiffness is high (the area which is not yet processed). Therefore, even if the perturbation is received, the process load is not applied to the area where the stiffness is low, and the collapse of the piezoelectric pole 112 is prevented.

Figure 12:
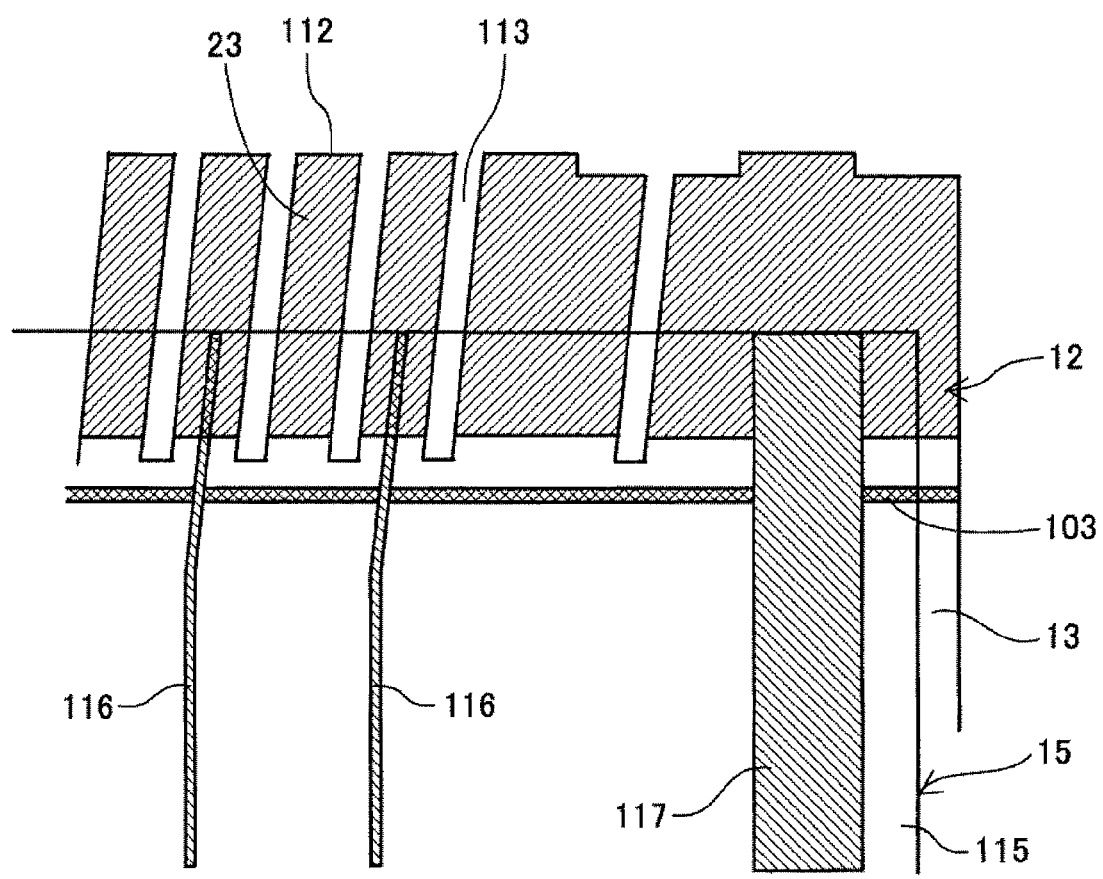
FIG. 12 is an explanatory diagram magnifying a state in which a feed member according to a second embodiment of the piezoelectric actuator is joined.

Next, in a second embodiment, the piezoelectric actuator 100 is explained by referring to FIG. 12. Here, FIG. 12 is a diagram magnifying and illustrating a major portion of the piezoelectric actuator in a state in which the feed member 15 of the piezoelectric actuator 100 is joined. Further, the feed member 15 is indicated in a transparent state (the same in the figures below). In the feed member 15 of the embodiment, wiring electrodes 116, which are connected to the electrodes 23 of the piezoelectric poles 112 (the driving piezoelectric poles 12A), are attached to a base substrate 115. At least portions of the wiring electrodes 116 of the feed member 15, which correspond to the piezoelectric poles 112 (the portions connected to the electrodes 23), are inclined in the same direction as the direction in which the piezoelectric poles 112 are inclined. Here, a common electrode wiring 117 is also formed in the feed member 15.

The feed member 15, as described above, is formed of the FPC as the flexible wiring substrate, and the wiring electrodes 116 made of copper are coated with solder. The connections between the wiring electrodes 116 of the feed member 15 and the individual electrodes 23 of the piezoelectric poles 112 are established by melting the solder with a heater chip or a laser.

In this manner, by inclining the wiring electrodes 116 of the feed member 15 in the direction which is the same as the direction in which the piezoelectric poles 112 are inclined, disconnections between the wiring electrodes 116 of the feed member 15 and the electrodes 23 of the piezoelectric poles 112 or a short such that one of the wiring electrodes 116 is connected to the electrode 23 of the neighboring piezoelectric pole 112 can be prevented, even if the distance between the piezoelectric poles 112 is small.

Figure 13:
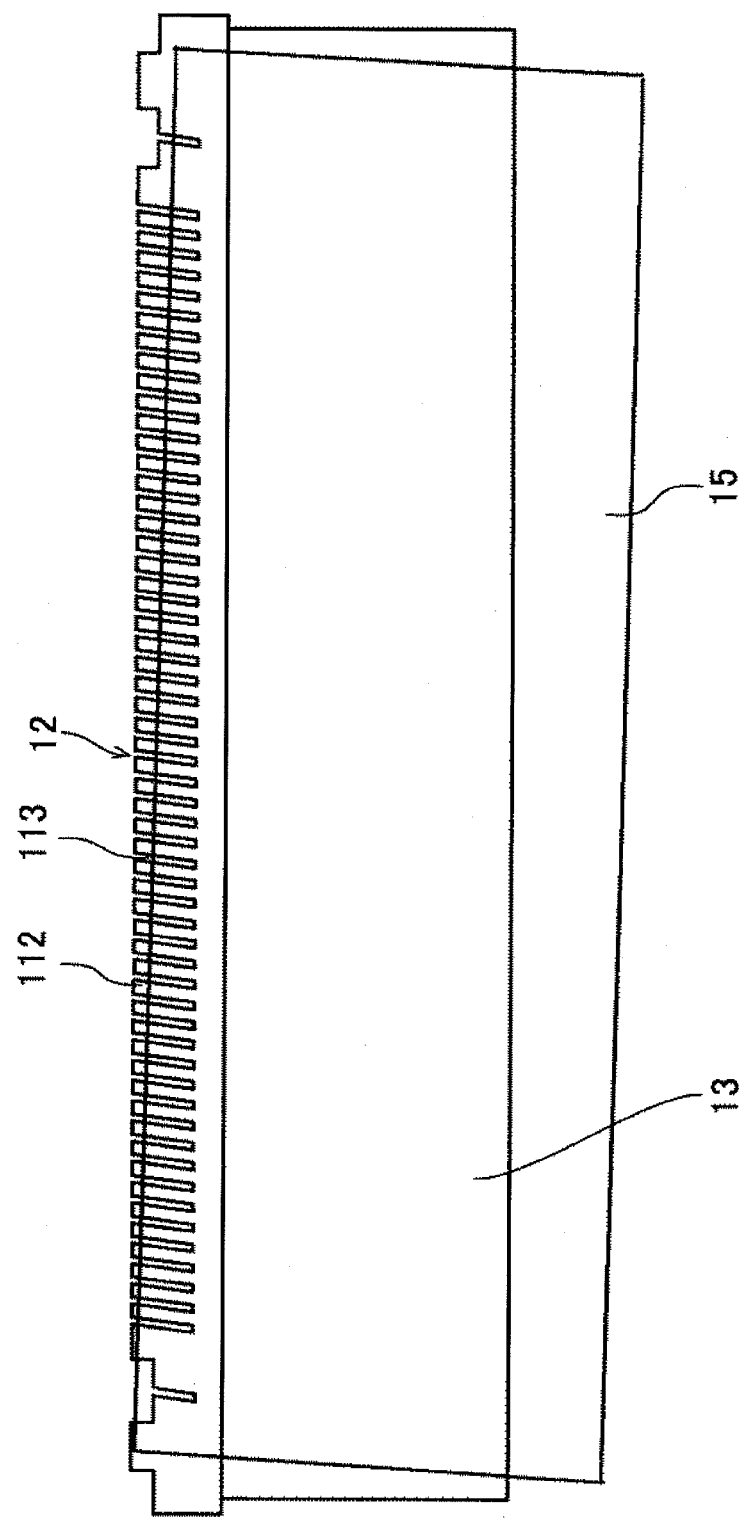
FIG. 13 is a front explanatory view illustrating a state in which a feed member according a third embodiment of the piezoelectric actuator is joined.
Figure 14:
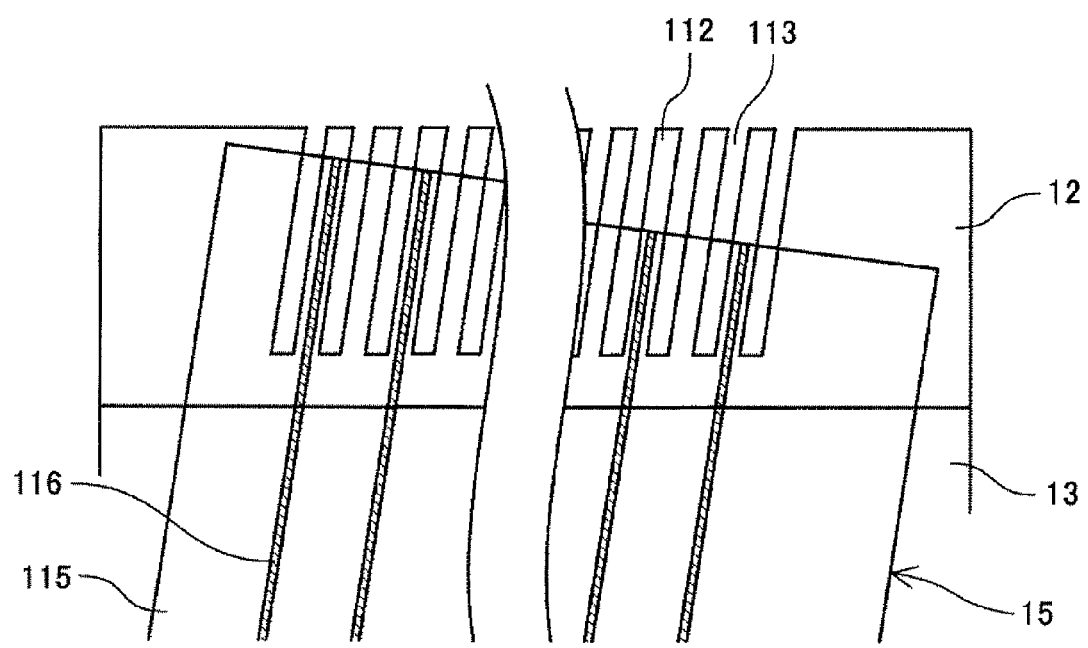
FIG. 14 is an explanatory diagram magnifying major portions of the piezoelectric actuator.

Next, in a third embodiment, the piezoelectric actuator 100 is explained by referring to FIGS. 13 and 14. Here, FIG. 13 is a front view of the piezoelectric actuator illustrating a state in which the feed member 15 of the piezoelectric actuator 100 is joined, and FIG. 14 is a diagram magnifying and illustrating a major portion. In the feed member 15 of the embodiment, the wiring electrodes 116, which are connected to the electrodes 23 of the piezoelectric poles 112 (the driving piezoelectric poles 12A), are attached to the base substrate 115. Each wiring electrode 116 of the feed member 15 has a line shape (a straight-line shape).

The feed member 15 is inclined in the direction which is the same as the direction in which the piezoelectric poles 112 are inclined, and the wiring electrodes 116 are connected to the electrodes 23 of the piezoelectric poles 112 (the driving piezoelectric poles 12A).

In this manner, when the inclination amount of the piezoelectric poles 112 is varied, by inclining the feed member 15 in accordance with the inclination amount, disconnections or shorts, when the feed member 15 is joined, can be prevented.

Further, when two lines of the piezoelectric members 15 are arranged on the base substrate 115 as described above, the inclination direction of the piezoelectric poles 112 of the piezoelectric member 12 on one of the surfaces to which the feed member 15 is joined is reversed to the inclination direction of the piezoelectric poles 112 of the piezoelectric member 12 on the other surface to which another feed member 15 is joined. However, in such a case, the position adjustment between the wiring electrodes 116 of the feed member 15 and the electrodes 23 of the piezoelectric poles 112 can be easily performed.

Figure 15:
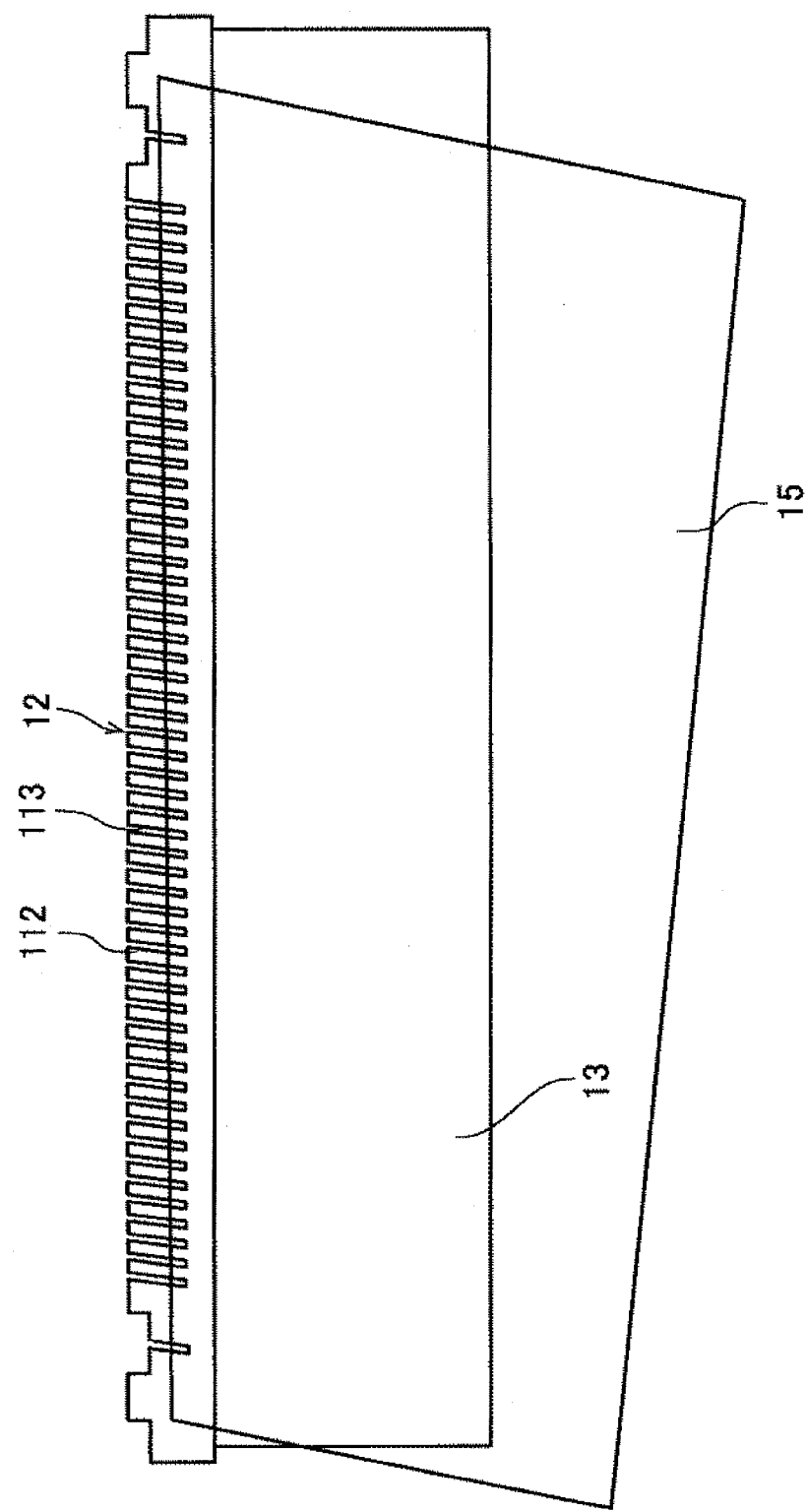
FIG. 15 is a front explanatory view illustrating a state in which a feed member according to a fourth embodiment of the piezoelectric actuator is joined.
Figure 16:
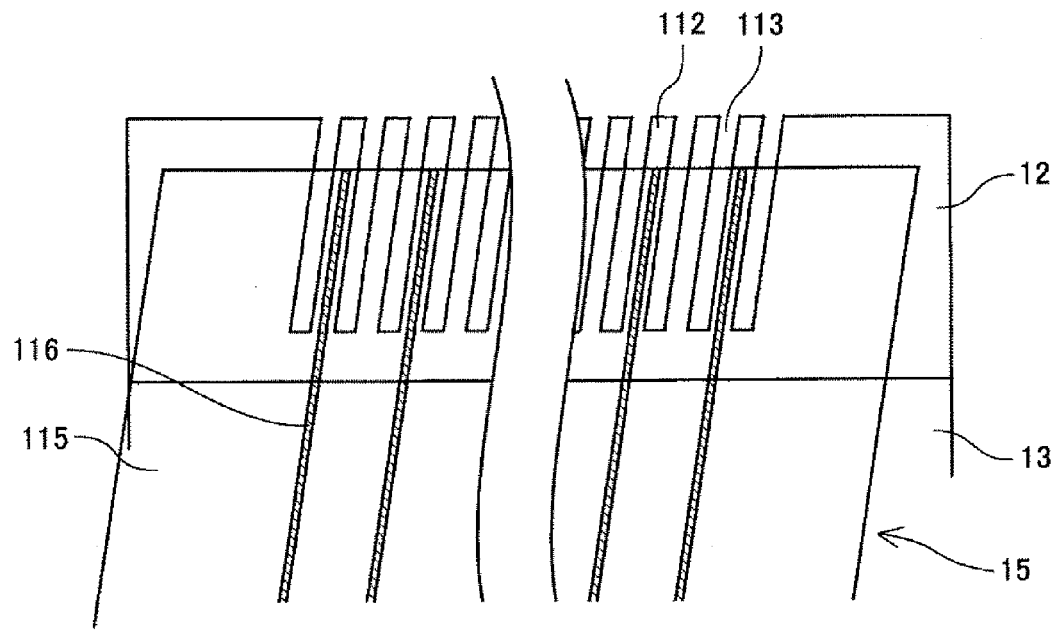
FIG. 16 is an explanatory diagram magnifying major portions of the piezoelectric actuator.

Next, in a fourth embodiment, the piezoelectric actuator is explained by referring to FIGS. 15 and 16. Here, FIG. 15 is a front view of the piezoelectric actuator illustrating a state in which the feed member 15 of the piezoelectric actuator is joined, and FIG. 16 is a diagram magnifying and illustrating a major portion. In the feed member 15 of the embodiment, the wiring electrodes 116, which are connected to the electrodes 23 of the piezoelectric poles 112 (the driving piezoelectric poles 12A), are formed in the base substrate 115. Each wiring electrode 116 has a line shape (a straight-line shape). The base substrate 115 is has a trapezoidal shape (or in a parallelogram shape).

With such a configuration, the area which joins the electrode 23 of the piezoelectric pole 112 to the corresponding wiring electrode 116 of the feed member 15 can be set to be the same for all the piezoelectric poles 112.

Figure 17:
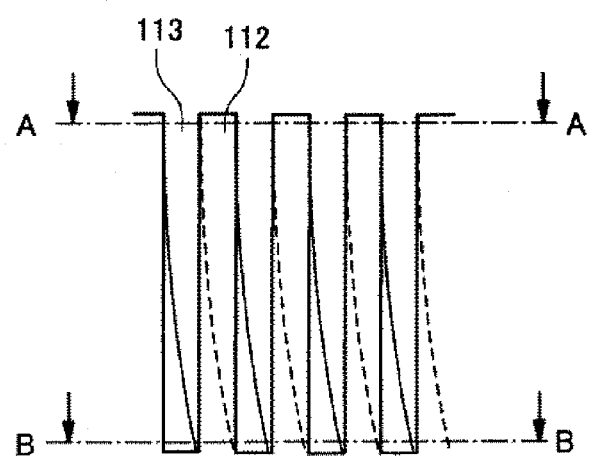
FIG. 17 is a front explanatory view illustrating a piezoelectric actuator according to a fifth embodiment.
Figure 18:
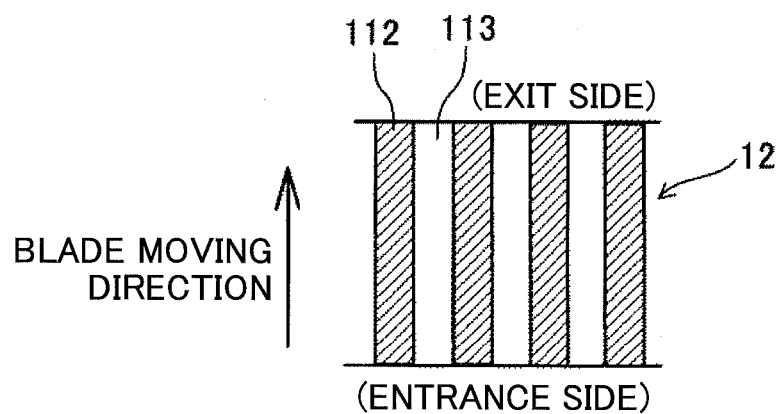
FIG. 18 is a sectional explanatory view along an A-A line in FIG. 17.
Figure 19:
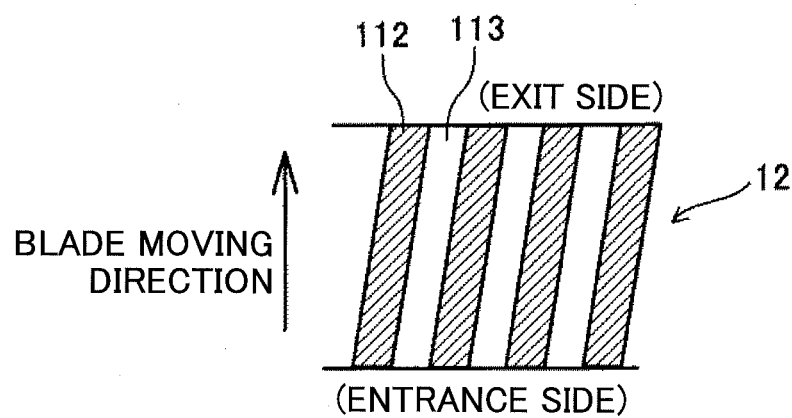
FIG. 19 is a sectional explanatory view along a B-B line in FIG. 17.

Next, in a fifth embodiment, the piezoelectric actuator 100 is explained by referring to FIGS. 17-19. Here, FIG. 17 is a front view illustrating the piezoelectric actuator, FIG. 18 is a cross-sectional explanatory diagram along the line A-A in FIG. 17, and FIG. 19 is a cross-sectional explanatory diagram along the line B-B in FIG. 17.

In the embodiment, in the direction perpendicular to the direction in which the piezoelectric poles 112 are arranged, the piezoelectric pole 112 is twisted from the top end portion to the base end portion, along a direction from one of the side portions to the other side portion, and the inclination amount is varied between the one of the side portions and the other side portion. Namely, as shown in FIG. 18, at the top end portion of the piezoelectric poles 112 (at a side of the joint surface joined to the vibration plate member 2), the piezoelectric poles 112 are formed to be almost straight in the direction perpendicular to the direction in which the piezoelectric poles 112 are arranged (perpendicular to the side surfaces), and as shown in FIG. 19, at the base end portion of the piezoelectric poles 112, the piezoelectric poles 112 are formed to be inclined with respect to the direction in which the piezoelectric poles 112 are arranged. In such a configuration, on one side surface in the direction which is perpendicular to the direction in which the piezoelectric poles 112 are arranged, the piezoelectric poles 112 are perpendicular, and on the other side surface, the piezoelectric poles 112 are inclined.

In order to form such a structure, when the groove processing is performed on the piezoelectric member 12 using the dicing blade, as described above, the dicing blade having the configuration such that the resistance of the one of the surfaces is different from the resistance of the other surface is used; the dicing blade is set to be perpendicular and the dicing blade is moved with respect to the piezoelectric member 12. At this time, the dicing blade is perpendicular at the entrance side, but as the cutting process proceeds, the dicing blade moves while the outer periphery of the dicing blade is gradually twisted by the difference between the resistance of the one of the surfaces and the resistance of the other surface. Therefore, the groove 113 having a shape corresponding to the shape of the above described piezoelectric pole 112 is formed.

As described above, since, on one side surface, the piezoelectric poles 112 are perpendicular, it is not necessary to incline the connecting portions of the electrodes of the FPC 15, contrary to the second and forth embodiments, or it is not necessary to incline the FPC 15 to connect. Therefore, the electrodes 116 of the flexible wiring substrate (FPC15) and the electrodes 23 of the piezoelectric poles 112 are easily connected. Further, since the piezoelectric poles 112 are twisted, the piezoelectric poles 112 are stronger against a force from above (a force in a direction facing to the top end portion). Therefore, when the piezoelectric poles 112 are heated, pressed and bonded to the vibration plate member 2 using a thermosetting adhesive, the pressing force may be increased. Accordingly, reliability on bonding can be improved.

Further, when a thin blade is used for such processing, as shown in FIG. 17, the inclination of the groove 113 at the exit side of the dicing blade is not linear, but the inclination becomes greater, along the downward direction (toward the base end side of the piezoelectric pole 112). However, such a configuration has the same effect.

Since the above described liquid discharge head includes the piezoelectric actuator 100 according to the embodiment, the nozzles can be highly densified.

Further, by integrating the above described liquid discharge head and a tank for supplying the liquid to the liquid discharge head, a liquid cartridge with integrated head (a head with integrated cartridge) can be obtained.

Figure 23:
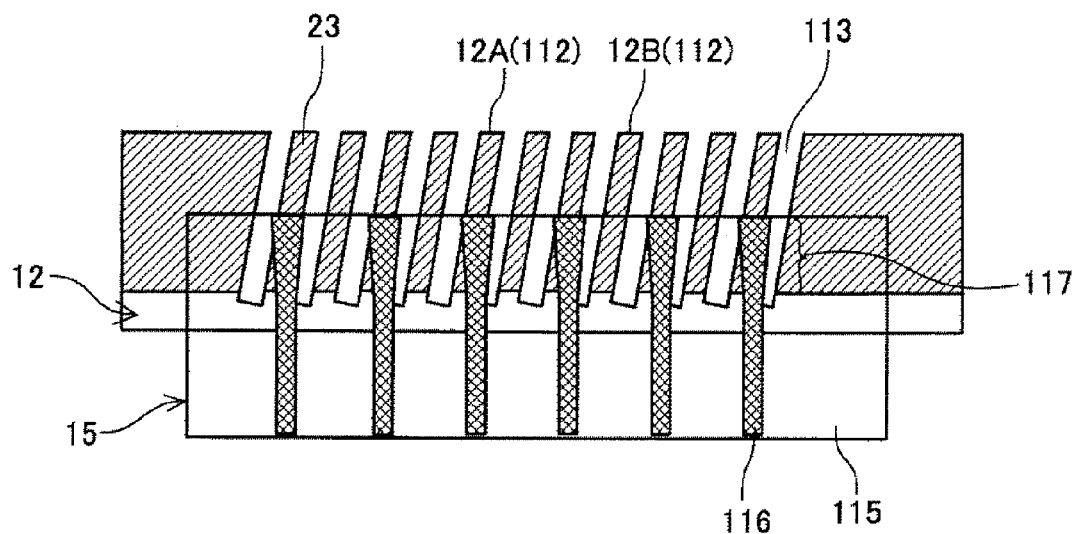
FIG. 23 is a front explanatory view of a joining portion between a piezoelectric member and an FPC according to a sixth embodiment.
Figure 24:
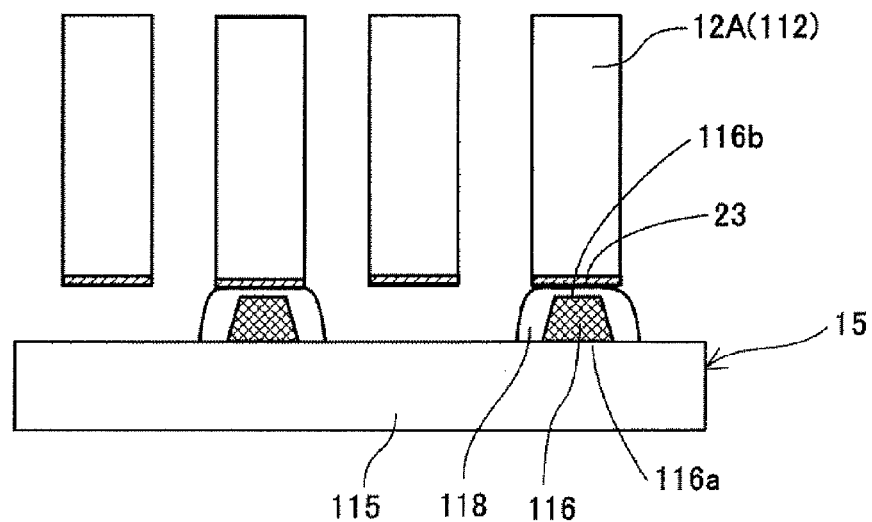
FIG. 24 is a plan explanatory view magnifying a state of the FPC prior to being joined.
Figure 25:
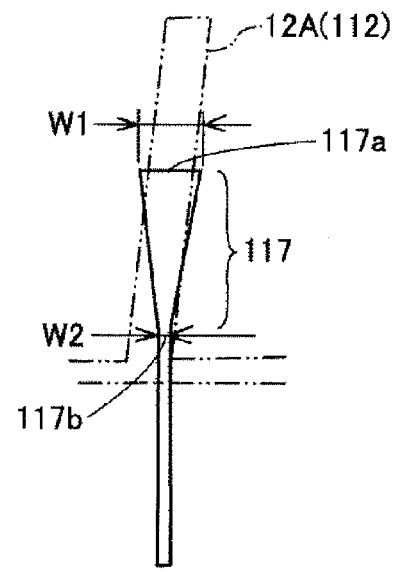
FIG. 25 is a plan explanatory view magnifying the state of the FPC prior to being joined.

Next, a sixth embodiment of the present invention is explained by referring to FIGS. 23-25. Here, FIG. 23 is a front view illustrating a joint portion between the piezoelectric member 2 and the FPC 15, FIG. 24 is a magnified explanatory plane view showing a state of the FPC 15 prior to being joined, and FIG. 25 is a diagram magnifying and illustrating the joint portion of the common electrode wiring 117 of the FPC 15. Further, the FPC 15, except for the common electrode wiring 17, is shown in a transparent state (the same in the following).

As described above, in the piezoelectric actuator 100, the two piezoelectric members 12 are arranged in parallel on the base member 13, made of such as SUS430, and the two piezoelectric members 12 are adhesively fixed to the base member 13 with an acrylic anaerobic adhesive 103. On the piezoelectric member 12, plural piezoelectric poles 112 (used as a generic term including the driving piezoelectric poles 12A and the non-driving piezoelectric poles 12B) are formed by the grooves 113.

Here, the plural piezoelectric poles 112 of the piezoelectric member 12 are formed to be inclined in a direction in which the piezoelectric poles 112 are arranged (a direction in which the nozzles are arranged). The piezoelectric poles 112 are inclined at a constant angle from a base end portion (a bottom side of the groove 113) to a top end portion in a depth direction of the groove 113 (a height direction of the piezoelectric pole 112).

Specifically, the dimensions of the piezoelectric poles are such that, for example, for 600 dpi, a width in the direction in which the piezoelectric poles are arranged is about 23 μm, a height is about 350 μm, and a width of the processed groove 113 is about 19 μm. Further, an inclination amount (a shift amount between the base end portion and the top end portion of the piezoelectric pole 112 in the direction in which the piezoelectric poles 112 are arranged) of the piezoelectric pole 112 is about 10 μm.

On the other hand, in the FPC 15 as a flexible wiring substrate, the wiring electrodes (patterns) 116, which are connected to the electrodes 23 of the piezoelectric poles 112 (driving piezoelectric poles 12A), are arranged on the base substrate 115, made of such as polyimide. A joining portion (common electrode wiring) 117 of the wiring electrode 116 in the FPC 15 is formed in a shape such that a width of the joining portion 117 gradually increases, along a direction from the base end side to the top end side. Namely, the width W1 in the direction in which the piezoelectric poles 112 are arranged at the top end portion of the joining portion 117 (a top end side of the piezoelectric pole 112) is greater than the width W2 at the base end portion of the joining portion 117 (W1>W2).

Specifically, thickness of the wiring electrode 116, which is a copper electrode, is 8 μm, the width at the top end portion (the wider portion) is 20 μm, and the width at the base end portion (the narrower portion) is 10 μm. Further, the joining portion 117 of the wiring electrode 116, which is joined to the electrode 23 of the piezoelectric pole 112, is coated with solder (Sn/Bi) 118. Here, the thickness of the solder coat is about 5 μm. When the joining portion 117 is coated with the solder, the width of the wider portion of the wiring electrode 116 is about 30 μm, and the width of the narrower portion of the wiring electrode 116 is about 20 μm.

Here, the maximum value of an accumulated pitch error of the wiring electrodes 116 of the FPC 15 in the direction in which the piezoelectric poles are arranged is 10 μm. When the wiring electrodes 116 are joined to the electrodes 23 of the piezoelectric poles 112, the center position of the FPC 15 is determined and the accumulated pitch error is divided into the right portion and the left portion. Thus a position offset error is 5 μm.

An overlapped length of the wiring electrode 116 of the FPC 15 with respect to the electrode 23 of the piezoelectric pole 112 of the piezoelectric member 12 is set to be about 200 μm. Then, a position adjustment is performed while the top end side (the wider portion) of the wiring electrode 116 of the FPC 15 is used as a reference. After that, the electrode 23 of the piezoelectric pole 112 and the wiring electrode 116 are joined by melting the solder 118 with a heating unit using a semiconductor laser.

At this time, the copper electrode portion (the wiring electrode 116) is heated by irradiation of a laser beam from a rear side of the FPC 15, and the solder 118 can be melted without heating the polyimide of the base substrate 115 of the FPC 15. Thus the wiring electrodes 116 of the FPC 15 can be joined without causing an increase of the accumulated pitch error. Therefore, finer pitch solder joining can be realized.

Since the width at the base end side of the joining portion 117 of the wiring electrode 116 of the FPC 15 is less than the width of the top end portion of the joining portion 117, even if the FPC 15 is obliquely joined, a short between the wiring electrode 116 and the neighboring piezoelectric pole 112 is prevented. Further, when the piezoelectric poles 112 are inclined, since the wiring electrodes 116 of the FPC 15 are relatively inclined, a short between the wiring electrode 116 and the neighboring piezoelectric pole 112 is prevented.

In a conventional configuration in which the width of the wiring electrode 116 of the FPC 15 is constant from the top end side to the base end side, the base end side of the wiring electrode 116 contacts the neighboring non-driving piezoelectric pole 12B, and the driving signal is applied to the non-driving piezoelectric pole 12B. On the other hand, with the configuration shown in FIG. 23, the wiring electrode 116 can be prevented from contacting the neighboring piezoelectric pole 112 at the base end side. Further, since the top end side is wider, a joining area between the driving piezoelectric pole 12A and the wiring electrode 116 can be sufficiently secured, and the reliability of the connection can be ensured.

Here, in the embodiment, the piezoelectric poles 112 are obliquely formed. However, the configuration of the piezoelectric poles 112 is not limited to this. Even for the piezoelectric poles 112 that are perpendicularly formed, tolerance of parallelism between the piezoelectric pole 112 and the wiring electrode 116 for joining the FPC 15 is increased as described above, and the reliability of the connection can be improved and the manufacturing cost can be reduced.

Further, as described above, when two of the piezoelectric members 12 are arranged, since the inclination directions of the piezoelectric poles 112 during dicing are the same, the inclination direction of the piezoelectric poles 112 of one of the piezoelectric members 12, when the piezoelectric members 12 are viewed from the joining surface of the FPC 15, is reversed to the inclination direction of the piezoelectric poles 112 of the other piezoelectric member 12.

In the FPC of the above described embodiment, the width the wiring electrode 116 at the top end side is broadened, with respect to the base end side, evenly to the right and to the left. Therefore, when the FPC 15 is joined to one of the joining surfaces and the same FPC 15 is joined to the other joining surface in which the inclination angles of the piezoelectric poles 112 are different, a gap between the neighboring piezoelectric pole 112 and the wiring electrode 116 of the FPC 15 at the base end side can be secured, and a short does not occur.

Figure 26:
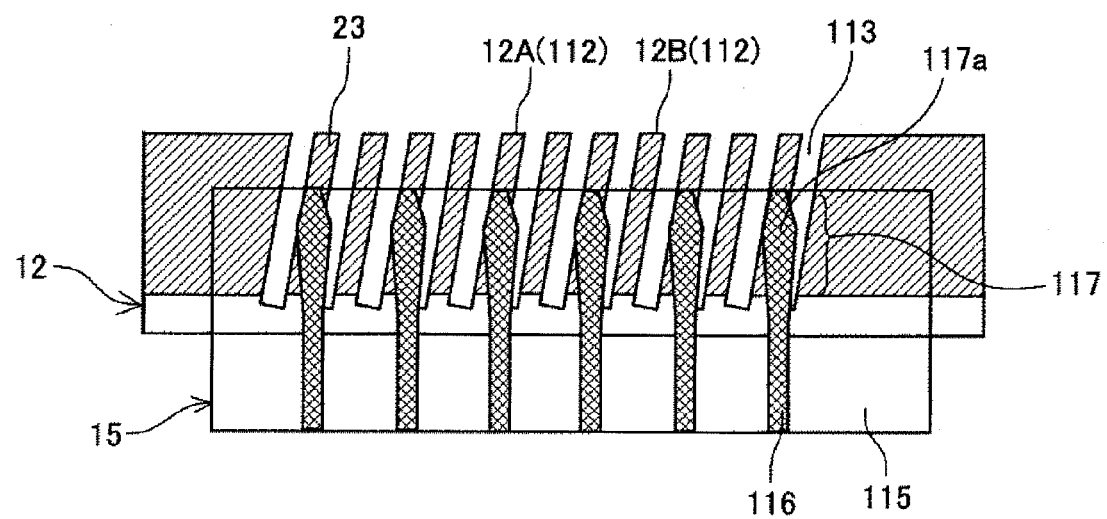
FIG. 26 is a front explanatory diagram illustrating a joining portion between a piezoelectric member and an FPC according to a seventh embodiment.
Figure 27:
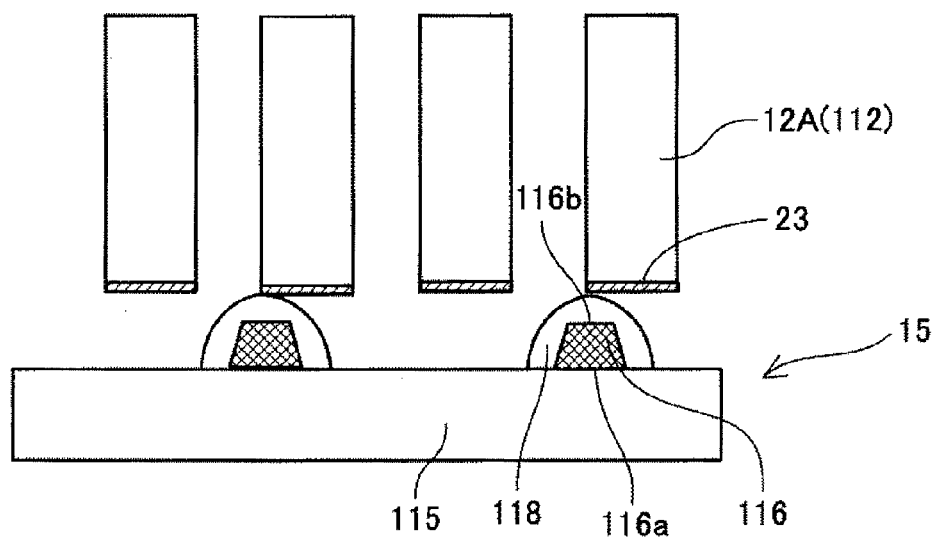
FIG. 27 is a plan explanatory view magnifying the state of the FPC prior to being joined.

Next, a seventh embodiment of the present invention is explained by referring to FIGS. 26 and 27. Here, FIG. 26 is a front view illustrating the joining portion between the piezoelectric member 12 and the FPC 15, and FIG. 27 is a magnified explanatory plane view showing a state of the FPC 15 prior to being joined. The joining portion 117 of the wiring electrode 116 of the FPC 15 is formed in a rhombus shape.

By shaping the joining portion 117 of the wiring electrode 116 of the FPC 15 in a rhombus shape, with respect to an error during cutting the outline of the FPC 15, a wider portion 117a of the joining portion 117 of the wiring electrode 116 of the FPC 15 can be fixed and a position for performing alignment can be fixed. Therefore, a short between the joining portions 117 can be prevented.

Namely, in the sixth embodiment, since the top end side of the wiring electrode 116 is broadened, the width of the wider portion may be slightly varied because of an error in a cutting position at the top end side, when the outline of the FPC 15 is cut and separated from a reel. The variation of the width of the wiring electrode 116 can cause an occurrence of a short between the piezoelectric poles 112. Therefore, it is preferable to reduce the variation as much as possible. With the seventh embodiment, the wider portion 117a can be formed to have a fixed width.

In this case, since the wider portion 117a is formed in the joining portion 117 of the wiring electrode 116 of the FPC 15, the joining area for solder joining can be sufficiently secured, and the reliability of the joining can be ensured.

Specifically, the width of the wider portion 117a of the joining portion 117 of the wiring electrode 116, which is a copper electrode, is 20 μm, and the width at the base end portion is 6 μm. Further, the joining portion 117 of the wiring electrode 116, which is joined to the electrode 23 of the piezoelectric pole 112, is coated with solder (Sn/Bi) 118 (cf. the sixth embodiment). Here, the thickness of the solder coat is about 5 μm. When the joining portion 117 is coated with the solder, the width of the wider portion 117a of the joining portion 117 of the wiring electrode 116 is about 30 μm, and the width of the base end portion is about 16 μm.

Here, it is preferable that the inclination angle at a portion of the wiring electrode 116 of the FPC 15, where the width decreases along the downward direction, be smaller than the inclination angle of the piezoelectric pole 112. With this configuration, even if an inclination occurs during the alignment between the FPC 15 and the piezoelectric poles 112, a short between the electrode 116 and the neighboring piezoelectric pole 112 at the base end side of the joining portion 117 of the FPC 15 can be prevented from occurring. Specifically, when the piezoelectric pole 112 is inclined by 10 μm with respect to the depth 350 μm of the processed groove 113 of the piezoelectric member 12, the wiring electrode 116 may be joined to the electrode 23 of the piezoelectric pole 112, so that the overlapped length from the wider portion to the base end portion is about 200 μm.

Further, since the width at the base end of the wiring electrode 116 is 6 μm, which is less than the thickness of 8 μm of the wiring electrode 116, the shape of the solder coated wiring electrode 116 is close to a semicircle shape. Further, as shown in FIG. 27, by shaping the cross section of the wiring electrode 116 of the FPC 15 to be a trapezoidal shape, the width of the wiring electrode 116 at a top surface 116b of the wiring electrode 116 of the FPC 15, which contacts the piezoelectric pole 112, can be reduced. Thus, when the FPC 15 is aligned with the piezoelectric poles 112, the wiring electrode 116 of the FPC 15 can be prevented from contacting the neighboring piezoelectric pole 112. Therefore, a short can be prevented. On the other hand, since the width of the wiring electrode at a bottom surface 116a is greater, when the molten solder flows, the joining area having the width of the bottom surface 116a can be secured. Therefore, the reliability of the joining can be ensured.

Figure 28:
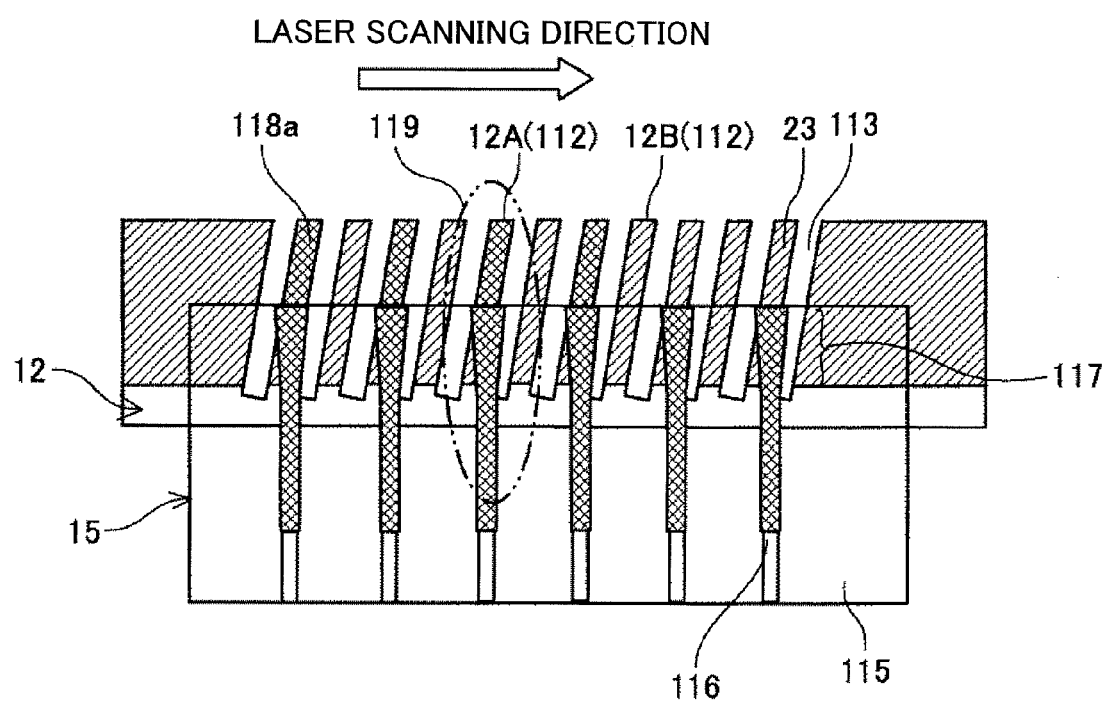
FIG. 28 is a front explanatory view of the joining portion between the piezoelectric member and the FPC for explaining a manufacturing method of the liquid discharge head.

Next, a manufacturing method of the liquid discharge head according to the embodiments is explained by referring to FIG. 28. Here, FIG. 28 is a front view illustrating the joining portion between the piezoelectric member 12 and the FPC 15. FIG. 28 is for explaining the manufacturing method. When the piezoelectric poles 112 are inclined and the width of the overlapped portion of the joining portion 117 of the FPC 15 is increased, a short between the wiring electrode 116 of the FPC 15 and the neighboring piezoelectric pole 112 tends to occur. On the other hand, in order to improve the reliability of the joining, it may be required to lengthen (broaden) the joining length (area).

Here, the length of the individual electrode 23 of the piezoelectric pole 112 is about 350 μm, and the overlapped length (the length in the rising direction of the piezoelectric pole 112) of the wiring electrode 116 of the FPC 15 and the individual electrode 23 of the piezoelectric pole 112 is 200 μm. Further, the solder 118 for joining is formed as a coating of the joining portion 117 of the wiring electrode 116 of the FPC 15.

The solder 118 can be melted by irradiating a laser beam to the entire surface of the joining portion 117 of the FPC 15 from the surface of the polyimide, which is the material of the base substrate 115. Further, a laser beam is also irradiated to a portion of the surface of the individual electrode 23 of the piezoelectric pole 112, which is not overlapped with the FPC 15, and the portion is heated. Then the solder 118 is melted and spread (shown by solder 118a), and the joining area of the solder 118 to the piezoelectric pole 112 can be enlarged.

Here, since the irradiation of the laser beams are performed within a very short time interval, the surface of the individual electrode 23 of the piezoelectric pole 112 is heated, but the inside of the piezoelectric pole 112 is not heated. Thus the polarization characteristic of the piezoelectric pole 112 is not damaged.

In a usual joining by laser irradiation, since a heating time is very short, the solder 118 is melted only at the vicinity of the irradiated portion. When only the top end portion of the joining portion 117 of the FPC 15 is heated, the solder 118 at the base end portion is not melted, and it is possible that the molten solder 118 at the top end portion forms a solder ball at the base end portion with surface tension. Here, the joining portion 117 of the FPC 15 is coated with the solder 118. The solder ball can be the cause of a short between the neighboring piezoelectric poles 112 or a short between the neighboring piezoelectric pole 112 and the wiring electrode 116.

On the other hand, according to the above described manufacturing method, the entire surface of the joining portion 117 of the FPC 15 is irradiated by the laser. Therefore, the solder 118 is melted and spread to form a fillet across the individual electrode 23 (shown by the solder 118a), without forming the solder ball. Thus the reliability of the joining can be also improved.

Further, by integrating the above described liquid discharge head and a tank for supplying the liquid to the liquid discharge head, a liquid cartridge with integrated head (a head with integrated cartridge) can be obtained.

Figure 20:
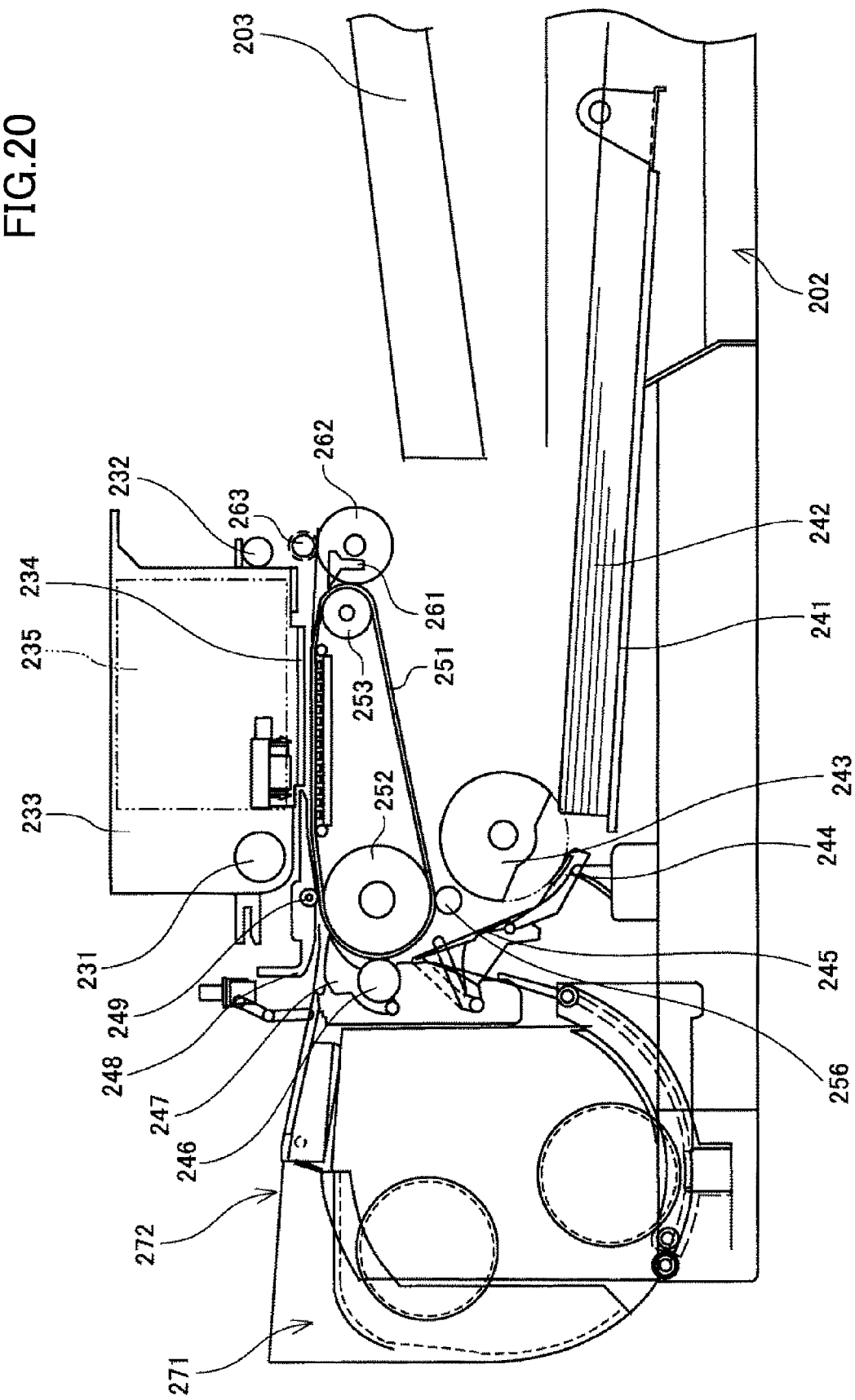
FIG. 20 is a schematic configuration diagram illustrating an entire configuration of mechanical portions of an example of the image forming device according to the embodiment.
Figure 21:
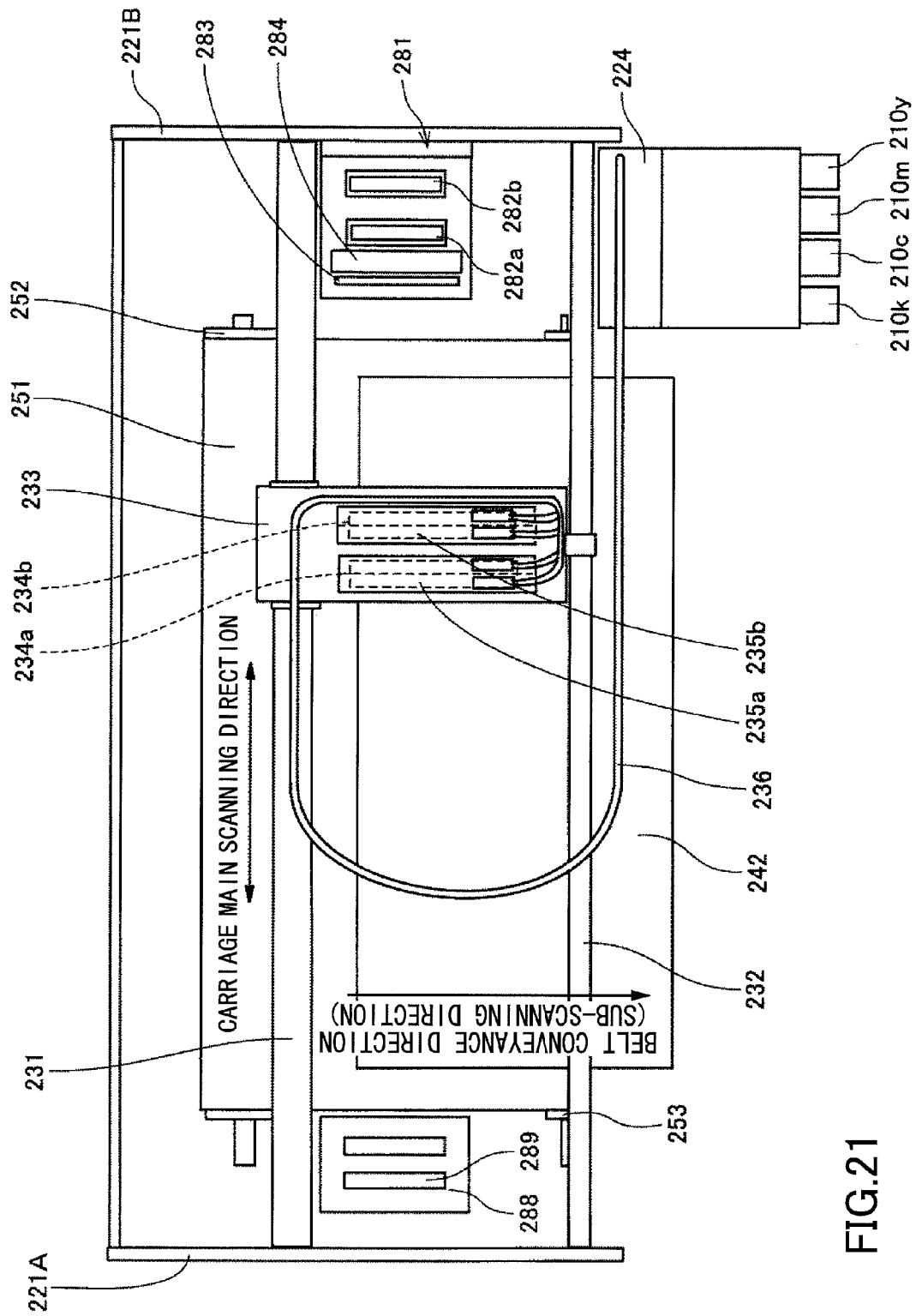
FIG. 21 is a plan explanatory view of major portions of the mechanical portions.

Next, an example of an image forming device including the liquid discharge head is explained by referring to FIGS. 20 and 21. Here, FIG. 20 is a schematic diagram illustrating an entire configuration of mechanical portions of the image forming device, and FIG. 21 is a plan view illustrating major portions of the mechanical portions of the image forming device. The image forming device is a serial-type image forming device. A carriage 233 is supported by a main guide rod 231 and a sub guide rod 232 and is slidable in the main scanning direction. Here, the main guide rod 231 and the sub guide rod 232 are supported by a left side plate 221A and a right side plate 221B. The carriage 223 is moved in the directions of the arrows (a carriage main scanning direction) by a main scanning motor, which is not shown in the figure, through a not-shown timing belt, and the carriage 223 scans.

In the carriage 233, a recording head 234 including the liquid discharge heads according to the embodiment is attached. The liquid discharge heads discharge yellow (Y) ink droplets, cyan (C) ink droplets, magenta (M) ink droplets, and black (K) ink droplets. Here, the recording head 234 is attached to the carriage 233, so that nozzle lines including plural nozzles are arranged in the sub-scanning direction, which is perpendicular to the main scanning direction, and the direction in which the ink droplets are discharged is the downward direction.

In the recording head 234, a liquid discharge head 234a having two nozzle lines and a liquid discharge head 234b having two nozzle lines are attached to a single base member. One of the two nozzle lines of the head 234a discharges the black (K) ink droplets, and the other nozzle line of the head 234a discharges the cyan (C) ink droplets. Further, one of the two nozzle lines of the head 234b discharges the magenta (M) ink droplets, and the other nozzle line of the head 234b discharges the yellow (Y) ink droplets. Here, the droplets of four colors are discharged using the two heads. However, the recording head 234 may includes four heads, and each of the heads may discharge a corresponding one of the four colors.

Further, in the carriage 233, sub-tanks 235a and 235b (when they are not distinguished, the sub-tanks are referred to as sub-tank 235), which supply the ink in each of the colors to the corresponding nozzle line, are mounted. The ink in each of the colors is supplied from an ink cartridge 210 of the corresponding color to the sub-tank 235 through a supply tube 236 by a supply unit 224.

On the other hand, a paper feeding unit for feeding recording papers 242, which are stacked on a paper stacking unit (a plate) 241 of a paper feed tray 202, includes a semilunar roller (a feed roller) 243 which takes the recording papers 242 from the paper stacking unit 241, separates the recording papers 242 one by one, and feeds the recording paper, and a separation pad 244 which is facing to the feed roller 243 and made of a material having a large friction coefficient. The separation pad 244 is pressed toward the side of the feed roller 243.

The image forming device includes a guide member 245 for guiding the recording paper 242, a counter roller 246, a conveyance guide member 247, and a pressing member 248 which includes a tip pressing roller 249, so as to convey the recording paper 242, which has been fed from the paper feeding unit, to the lower side of the recording head 234. Further, the image forming device includes a conveyance belt 251 which electrostatically adheres the recording paper 242, which has been fed, and which is for conveying the recording paper 242 at a position facing to the recording head 234.

The conveyance belt 251 is an endless belt. The conveyance belt 251 is supported by a conveyance roller 252 and a tension roller 253, and the conveyance belt 251 rotationally moves in a belt conveyance direction (the sub-scanning direction). Further, the image forming device includes a charging roller 256, which is a unit for charging the surface of the conveyance belt 251. The charging roller 256 contacts the surface of the conveyance belt 251, and the charging roller 256 is placed to be driven by the rotation of the conveyance belt 251. The conveyance belt 251 is rotationally driven in the belt conveyance direction by the rotation of the conveyance roller 252, when the conveyance roller 252 is driven by a sub-scanning motor, which is not shown in the figures, through a timing belt.

Further, as a paper discharging unit for discharging the recording paper 242, which has been recorded on by the recording head 234, the image forming device includes a separation nail 261 for separating the recording paper 242 from the conveyance belt 251, a discharging roller 262 and an ejection roller 263. Further, the image forming device includes a paper discharge tray 203 under the discharging roller 262.

Further, in a rear side portion of the main body of the image forming device, a double side unit 271 is detachably attached. The double side unit 271 takes in the recording paper 242, which is returned by reverse rotation of the conveyance belt 251, and feeds the recording paper 242 between the counter roller 246 and the conveyance belt 251 again. Further, the upper surface of the double side unit 271 is a manual feeding tray 272.

Further, in a non-printing area on one side in the main scanning direction of the carriage 233, a maintenance recovery unit 281 for maintaining and recovering states of the nozzles of the recording head 234 is arranged. The maintenance recovery unit 281 includes cap members (hereinafter, referred to as "caps") 282a and 282b (when they are not distinguished, they are referred to as "a cap 282") for capping the nozzle surfaces of the recording head 234, a wiper blade 283 that is a blade member for wiping the nozzle surfaces, and an idle discharge receiving unit 284 for receiving liquid droplets when an idle discharge for discharging the liquid droplets which do not contribute for recording is performed, in order to discharge the thickened ink.

Further, in the other non-printing area in the main scanning direction of the carriage 233, an idle discharge receiving unit 288 is arranged for receiving liquid droplets, when an idle discharge for discharging the liquid droplets which do not contribute for recording is performed, in order to discharge the thickened ink during recording. In the idle discharge receiving unit 288, an opening portion 289 is arranged along the direction of the nozzle line of the recording head 234.

In the image forming device, which is configured in such a manner, the recording papers 242 in the feed tray 202 are separated, and the recording papers 242 are fed one by one. The recording paper 242, which is fed almost vertically upward, is guided by the guide member 245, and conveyed while the recording paper 242 is pinched between the transfer belt 251 and the counter roller 246. Further, the tip is guided by a conveyance guide 237, and the tip is pressed by the tip pressing roller 249 to the conveyance belt 251. Then the conveyance direction of the recording paper 242 is switched by almost 90 degrees.

At this time, plus outputs and minus outputs are alternately and repeatedly applied to the charging roller 256, namely alternating voltages are applied to the charging roller 256. Then, on the conveyance belt 251, an alternating charged voltage pattern is formed. Namely, the conveyance belt 251 has zones having a predetermined width such that the zones are alternately charged plus and minus. When the recording paper 242 is fed on the conveyance belt 251, which is alternately charged plus and minus, the recording paper 242 is adhered to the conveyance belt 251, and the recording paper 242 is conveyed in the sub-scanning direction by the rotational movement of the transfer belt 251.

Then, by driving the recording head 234 depending on the image signal while moving the carriage 233, the ink droplets are discharged onto the suspended recording paper 242 and an amount corresponding to one line is recorded. After conveying the recording paper 242 by a predetermined conveyance amount, the next recording is performed. When a record termination signal is received or a signal indicating that the back end of the recording paper 242 has reached the recording area is received, the recording operation is terminated and the recording paper 242 is discharged onto the paper discharge tray 203.

As described above, since the image forming device includes the liquid discharge head according to the embodiment, the image forming device can form a high quality image.

Here, the above described embodiment is explained with the example in which the liquid discharge head according to the embodiment is applied to the serial-type image forming device. However, the liquid discharge head can be applied to a line-type image forming device.

Figure 22:
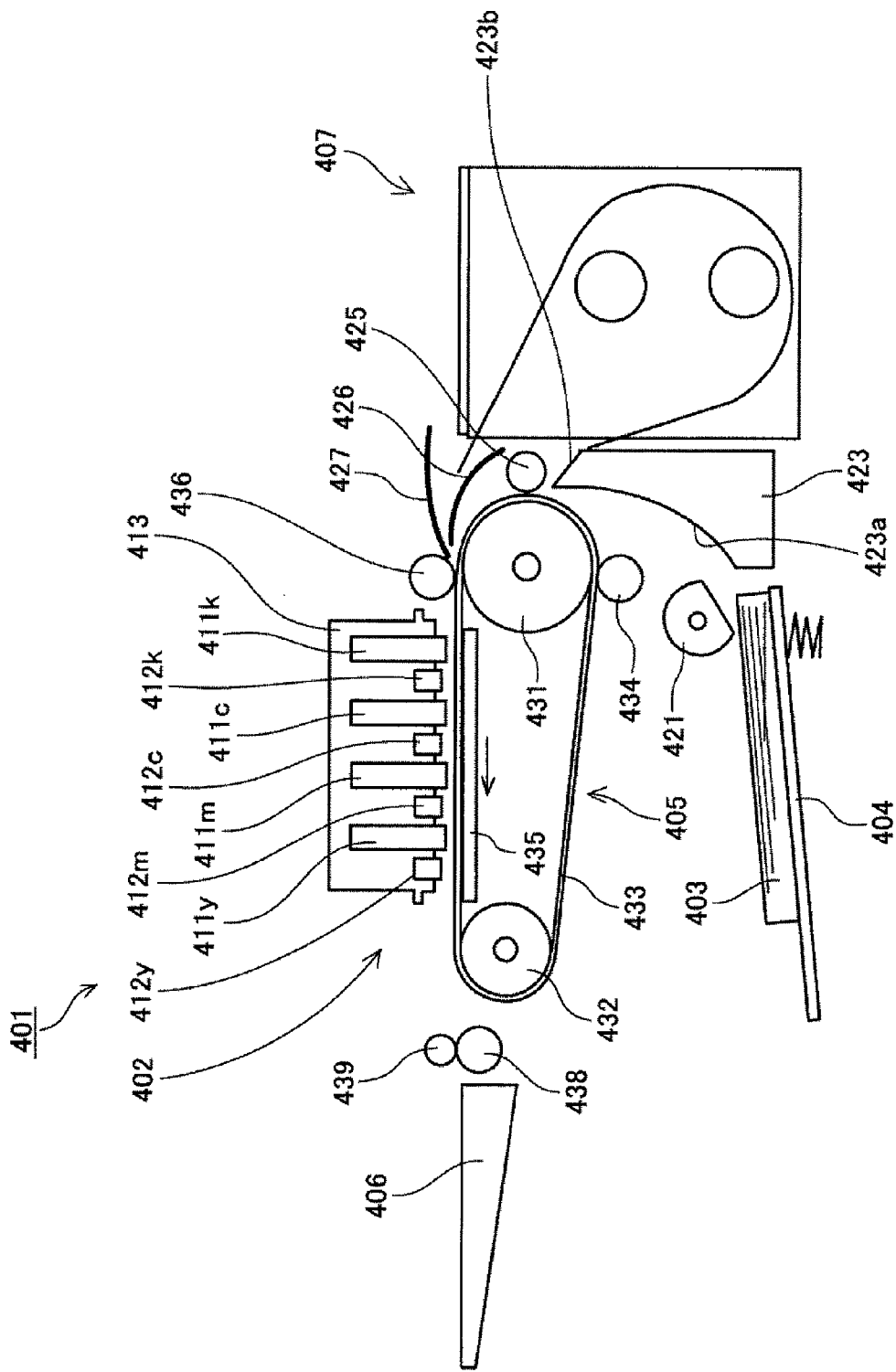
FIG. 22 is an overall configuration diagram showing another example of the image forming device.

Next, another example of the image forming device, which includes the liquid discharge head according to the embodiment, is explained by referring to FIG. 22. Here, FIG. 22 is a schematic configuration diagram illustrating the entire mechanical portions of the image forming device. The image forming device is a line-type image forming device. The image forming device includes an image forming unit 402 included inside a device main body 401, and a paper feed tray 404, on which many recording media (papers) 403 can be stacked and which is placed below the device main body 401. The image forming device takes in the recording paper 403 from the paper feed tray 404, records a desired image onto the recording paper 403 with the image forming unit 402 while conveying the recording paper 403 with a conveying mechanism 405, and discharges the recording paper 403 onto a paper discharge tray 406, which is attached at a side portion of the device main body 401.

Further, the image forming device includes a both-sides unit 407 which is detachably attached to the device main body 401. When both-sides printing is performed, the image forming device takes in the recording paper 403 to inside the both-sides unit 407 while conveying the recording paper 403 in a reverse direction with the conveying mechanism 405, after completing printing on a single side (the front side). Then the recording paper 403 is inverted, and the recording paper is fed to the conveying mechanism 405 again while the other side (the rear side) of the recording paper 403 is set to be a surface to be printed on. After the printing on the other side (the rear side) is completed, the recording paper 403 is ejected onto the paper discharge tray 406.

Here, the image forming unit 402 includes a recording head 411k which includes a full-line type liquid discharge head that discharges black (K) ink droplets, a recording head 411c which includes a full-line type liquid discharge head that discharges cyan (C) ink droplets, a recording head 411m which includes a full-line type liquid discharge head that discharges magenta (M) ink droplets, and a recording head 411y which includes a full-line type liquid discharge head that discharges yellow (Y) ink droplets. When the colors are not distinguished, the recording heads 411k, 411c, 411m, and 411y are referred to as "a recording head 411." Each of the recording heads 411 is attached to a head holder 413 while a nozzle surface, on which nozzles for discharging the liquid droplets are formed, faces downward.

Further, the image forming device includes maintenance recovery units 412k, 412c, 412m, and 412y (when the colors are not distinguished, they are referred to as "a maintenance recovery unit 412") that correspond to the recording heads 411k, 411c, 411m, and 412y, respectively, for maintaining and recovering the performances of the heads 411. When a maintenance and recovery operation, such as a purge process or a wiping process, is performed, the recording head 411 and the maintenance recovery unit 412 are relatively moved, so that the nozzle surface of the recording head 411 faces a capping member included in the maintenance recovery unit 412.

Here, the recording heads 411 are arranged in an order of black, cyan, magenta, and yellow, from an upstream side in the recording paper conveyance direction. However, the arrangement and the number of the colors are not limited to this. Further, as a line-type head, one or plural heads, in which plural nozzle lines are evenly spaced apart by a predetermined distance, may be used. Here, the plural nozzle lines discharge liquid droplets in corresponding colors. Furthermore, the head and a liquid cartridge for supplying an ink to the head may be integrally formed, and the head and the liquid cartridge may be separately formed.

The recording papers 403 on the paper feed tray 404 are separated by a feed roller (a semilunar roller) 421 and a separation pad (which is not shown in the figure), and the recording papers 403 are fed into the device main body 401 one by one. Then the recording paper 403 is conveyed to a nip between a registration roller 425 and a conveyance belt 433 along a guide surface 423a of a conveyance guide member 423. After that, the recording paper 403 is fed to the conveyance belt 433 of the conveying mechanism 405 at a predetermined timing through a guide member 426.

Further, on the conveyance guide member 423, a guide surface 423b for guiding the recording paper 403, which is fed from the both-sides unit 407, is formed. Further, the image forming device includes a guide member 427 for guiding the recording paper 403, which is returned from the conveyance mechanism 405, to the both-sides unit 407, when both-sides printing is performed.

The conveyance mechanism 405 includes the conveyance belt 433 which is an endless belt and supported by a conveyance roller 431, which is a driving roller, and a driven roller 432; a charging roller 434 for charging the conveyance belt 433; a platen member 435 for maintaining flatness of the conveyance belt 433 at a portion facing the image formation unit 402; a pressing roller 436 for pressing the recording paper 403 onto the conveyance belt 433 opposite to the conveyance roller 431; and a cleaning roller (not shown in the figure) made of a porous body, which is a cleaning unit for removing ink adhering to the conveyance belt 433.

In a downstream side of the conveyance mechanism 405, the image forming device includes a paper discharge roller 438 and a spur 439 for sending the recording paper 403, on which an image is recorded, to the paper discharge tray 406.

In the image forming device which has such a configuration, the conveyance belt 433 rotationally moves in the direction indicated by the arrow, and the conveyance belt 433 is charged when the conveyance belt 433 contacts the charging roller 434, to which a high voltage is applied. When the recording paper 403 is fed to the conveyance belt 433, which is charged in a high voltage, the recording paper 403 is electrostatically adhered to the conveyance belt 433. In this manner, on the recording paper 403, which is strongly adhered to the conveyance belt 433, warpage and irregularities are corrected, and a highly flat surface is formed.

Further, by rotating the conveyance belt 433 and moving the recording paper 403, and by discharging the liquid droplets from the recording head 411, a desired image is formed on the recording paper 403. The recording paper 403, on which the image is recorded, is discharged onto the paper discharge tray 406 by the discharging roller 438.

As described above, the image forming device includes the liquid discharge head according the embodiment. Therefore, the image forming device can form a high-quality image at high speed.

The above described embodiments are explained using the examples of the image forming device which includes the liquid discharge head according to the embodiment. However, the embodiments are not limited to this. For example, the liquid discharge head according to the embodiment can be applied to an image forming device, such as a combined machine in which a printer, a facsimile device, and a copier are combined. Further, the liquid discharge head according to the embodiment can be applied to an image forming device which uses a liquid other than an ink in a narrow meaning or a fixing liquid.

The present invention is not limited to the specifically disclosed embodiments, and variations and modifications may be made without departing from the scope of the present invention.

The present application is based on Japanese Priority Applications No. 2011-006055 filed on Jan. 14, 2011, No. 2011-060225 filed on Mar. 18, 2011, and No. 2011-113263 filed on May 20, 2011, the entire contents of which are hereby incorporated herein by reference.

What is claimed is:

1. A liquid discharge head comprising a piezoelectric actuator,
wherein the piezoelectric actuator includes a piezoelectric member on which plural piezoelectric poles are formed,
wherein each piezoelectric pole amongst the plural piezoelectric poles is tilted with respect to a direction in which the plural piezoelectric poles are arranged such that a base end portion of the piezoelectric pole is shifted from a top end portion of the piezoelectric pole by a predetermined distance in the direction in which the plural piezoelectric poles are arranged,
wherein amongst the plural piezoelectric poles, adjacent piezoelectric poles that are adjacent to each other in the direction in which the plural piezoelectric poles are arranged are tilted in a direction that is the same as the direction in which the plural piezoelectric poles are arranged, and
wherein each piezoelectric pole amongst the plural piezoelectric poles is tilted, even in a state in which a voltage is not applied to the piezoelectric pole.

2. The liquid discharge head according to claim 1,
wherein the inclinations of the piezoelectric poles are constant.

3. The liquid discharge head according to claim 1,
wherein each of the piezoelectric poles is a laminated piezoelectric element in which piezoelectric material layers and internal electrode layers are laminated, and
wherein the piezoelectric poles are formed to be inclined with respect to a direction which is perpendicular to the internal electrode layers.

4. The liquid discharge head according to claim 1,
wherein a feed member for transmitting driving signals to the corresponding piezoelectric poles is connected to the piezoelectric member,
wherein the feed member includes wiring electrodes which are connected to electrodes of the corresponding piezoelectric poles, and
wherein each of the wiring electrodes of the feed member is formed such that at least a portion of the wiring electrode which is joined to the electrode of the corresponding piezoelectric pole is inclined in the direction in which the piezoelectric poles are inclined.

5. The liquid discharge head according to claim 1,
wherein a feed member for transmitting driving signals to the corresponding piezoelectric poles is connected to the piezoelectric member,
wherein the feed member includes wiring electrodes which are connected to electrodes of the corresponding piezoelectric poles, and
wherein the feed member is connected to the piezoelectric member while an entirety of the feed member is inclined in the direction in which the piezoelectric poles are inclined.

6. The liquid discharge head according to claim 1, further comprising:
a flexible wiring substrate on which wiring electrodes are formed, the wiring electrodes being connected to the corresponding piezoelectric poles,
wherein the wiring electrodes on the flexible wiring substrate are joined to electrodes of the corresponding piezoelectric poles, and
wherein a joining portion of each of the wiring electrodes, which joins the wiring electrode to the electrode of the corresponding piezoelectric pole, is formed such that a width of the joining portions in a direction n which the plural piezoelectric poles are arranged narrows along a direction from a top end portion of the corresponding piezoelectric pole to a base end portion of the corresponding piezoelectric pole.

7. The liquid discharge head according to claim 6,
wherein an inclination angle of the joining portion, the joining portion having the width that narrows, is smaller than an inclination angle of the corresponding piezoelectric pole.

8. The liquid discharge head according to claim 1, further comprising:
a flexible wiring substrate on which wiring electrodes are formed, the wiring electrodes being connected to the corresponding piezoelectric poles,
wherein the wiring electrodes on the flexible wiring substrate are joined to electrodes of the corresponding piezoelectric poles, and
wherein a joining portion of each of the wiring electrodes, which joins the wiring electrode to the electrode of the corresponding piezoelectric pole, is formed in a rhombus shape.

9. The liquid discharge head according to claim 6,
wherein the width of the joining portion of each of the wiring electrodes at a base end side of the corresponding piezoelectric pole, in the direction in which the plural piezoelectric poles are arranged, is less than a thickness of the wiring electrode.

10. The liquid discharge head according to claim 6,
wherein the piezoelectric poles and the wiring electrodes are joined by a solder,
wherein a length of the joining portion of each of the wiring electrodes, which joins the wiring electrode to the corresponding piezoelectric pole, is shorter than a length of the corresponding piezoelectric pole, and
wherein the solder flows to a top end portion he electrode of the corresponding piezoelectric pole.

11. A method of manufacturing a liquid discharge head,
wherein the liquid discharge head includes a piezoelectric actuator that includes a piezoelectric member on which plural piezoelectric poles are formed,
wherein the plural piezoelectric poles are formed to be inclined in a direction in which the plural piezoelectric poles are arranged, by forming plural grooves on the piezoelectric member with a dicing blade such that a first resistance on a first surface of the dicing blade is different from a second resistance on a second surface of the dicing blade,
wherein amongst the plural piezoelectric poles, adjacent piezoelectric poles that are adjacent to each other in the direction in which the plural piezoelectric poles are arranged are inclined in a direction that is the same as the direction in which the plural piezoelectric poles are arranged, and wherein the plural piezoelectric poles are formed to be inclined, even in a state in which a voltage is not applied to the piezoelectric poles.

12. The method according to claim 11, wherein the liquid discharge head further includes a flexible wiring substrate on which plural wiring electrodes are formed, wherein the plural wiring electrodes are joined to electrodes of the corresponding piezoelectric poles by a solder; and wherein, when the flexible wiring substrate including the plural wiring electrodes, the wiring electrodes being coated by the solder in advance, is irradiated by laser beams, the solder is melted, and the plural wiring electrodes are joined to the electrodes of the corresponding piezoelectric poles, the laser beams being irradiated to portions of the wiring electrodes which are coated by the solder and to top end portions of the electrodes of the piezoelectric poles.

13. An image forming device comprising a liquid discharge head, wherein the liquid discharge head includes a piezoelectric actuator, wherein the piezoelectric actuator includes a piezoelectric member on which plural piezoelectric poles are formed, wherein each piezoelectric pole amongst the plural piezoelectric poles is tilted with respect to a direction in which the plural piezoelectric poles are arranged such that a base end portion of the piezoelectric pole is shifted from a top end portion of the piezoelectric pole by a predetermined distance in the direction in which the plural piezoelectric poles are arranged, wherein amongst the plural piezoelectric poles, adjacent piezoelectric poles that are adjacent to each other in the direction in which the plural piezoelectric poles are arranged are tilted in a direction that is the same as the direction in which the plural piezoelectric poles are arranged, and wherein each piezoelectric pole amongst the plural piezoelectric poles is tilted, even in a state in which a voltage is not applied to the piezoelectric pole.

* * * * *